(12) United States Patent
Haraguchi et al.

(10) Patent No.: US 11,038,012 B2
(45) Date of Patent: Jun. 15, 2021

(54) CAPACITOR DEVICE AND MANUFACTURING METHOD THEREFOR

(71) Applicants: ZENTEL JAPAN CORPORATION, Tokyo (JP); AP Memory Technology (Hangzhou) Limited Co., Hangzhou (CN)

(72) Inventors: Masaru Haraguchi, Tokyo (JP); Yoshitaka Fujiishi, Tokyo (JP)

(73) Assignees: AP Memory Technology Corp., Zhubei (TW); AP Memory Technology (Hangzhou) Limited Co., Hangzhou (CN)

( * ) Notice: Subject to any disclaimer, the term of this patent is extended or adjusted under 35 U.S.C. 154(b) by 66 days.

(21) Appl. No.: 16/609,159

(22) PCT Filed: Apr. 28, 2017

(86) PCT No.: PCT/JP2017/016977
§ 371 (c)(1),
(2) Date: Oct. 28, 2019

(87) PCT Pub. No.: WO2018/198330
PCT Pub. Date: Nov. 1, 2018

(65) Prior Publication Data
US 2020/0098853 A1    Mar. 26, 2020

(51) Int. Cl.
*H01L 49/02* (2006.01)
*H01L 27/10* (2006.01)
(Continued)

(52) U.S. Cl.
CPC ............ *H01L 28/90* (2013.01); *H01L 21/283* (2013.01); *H01L 21/32139* (2013.01);
(Continued)

(58) Field of Classification Search
CPC ................................ H01L 28/75; H01L 27/01
See application file for complete search history.

(56) References Cited

U.S. PATENT DOCUMENTS 6,770,974 B2 *   8/2004   Ejiri .................... H01L 27/0805
                                                                  257/750
9,472,690 B2    10/2016   Weng et al.
(Continued)

FOREIGN PATENT DOCUMENTS

JP          60-103690 A      6/1985
JP           4-111462 A      4/1992
(Continued)

OTHER PUBLICATIONS

International Search Report in the parent PCT application No. PCT/JP2017/016977, dated Jun. 27, 2017.
(Continued)

*Primary Examiner* — Grant S Withers
(74) *Attorney, Agent, or Firm* — Chen Yoshimura LLP

(57) ABSTRACT

In the present invention, lower electrodes (101, 102) are disposed at a period d1 in an X direction and at a period d2 in a Y direction. Upper electrodes (102) are disposed so as to be shifted by half the length of the period (d1) in the X direction with respect to the lower electrodes (101), and are disposed so as to be shifted by half the length of the period (d2) in the Y direction with respect to the lower electrodes (101). Each pair of a lower electrode (101) and an upper electrode (102), which face each other and capacitively couple with each other, form a capacitor cell (C). Cell terminals (103, 104) are disposed at the period (d1) in the X direction, disposed at the period (d2) in the Y direction, and respectively electrically connected to the lower electrodes (101) and the upper electrodes (102). The cell terminals (104) are disposed so as to be shifted by half the length of the period (d1) in the X direction with respect to the cell
(Continued)

terminals (103), and are disposed so as to be shifted by half the length of the period (d2) in the Y direction with respect to the cell terminals (103).

18 Claims, 33 Drawing Sheets

(51) Int. Cl.
*H01L 21/283* (2006.01)
*H01L 21/3213* (2006.01)
*H01L 23/522* (2006.01)
*H01L 23/528* (2006.01)
*H01L 27/108* (2006.01)

(52) U.S. Cl.
CPC ........ *H01L 23/528* (2013.01); *H01L 23/5226* (2013.01); *H01L 27/101* (2013.01); *H01L 28/75* (2013.01); *H01L 28/91* (2013.01); *H01L 27/1085* (2013.01); *H01L 27/10805* (2013.01)

(56) References Cited

U.S. PATENT DOCUMENTS

| | | | |
|---|---|---|---|
| 2001/0023110 A1 | 9/2001 | Fukuzumi et al. | |
| 2002/0030243 A1* | 3/2002 | Mikawa | H01L 28/60 257/532 |
| 2002/0180053 A1 | 12/2002 | Ejiri | |
| 2004/0084709 A1* | 5/2004 | Kim | H01L 28/60 257/306 |
| 2007/0080382 A1* | 4/2007 | Kikuchi | H01L 21/76846 257/295 |
| 2007/0291439 A1* | 12/2007 | Yeh | H01L 28/60 361/301.1 |
| 2008/0073685 A1* | 3/2008 | Wang | H01L 27/11507 257/295 |
| 2008/0079117 A1* | 4/2008 | Baumgartner | H01L 27/0805 257/532 |
| 2016/0204190 A1* | 7/2016 | Chu | H01L 23/5226 257/532 |
| 2016/0293334 A1* | 10/2016 | Ehara | H01G 4/018 |
| 2018/0247997 A1* | 8/2018 | Zelner | H01L 21/02282 |

FOREIGN PATENT DOCUMENTS

| | | |
|---|---|---|
| JP | 11-289062 A | 10/1999 |
| JP | 2002-43517 A | 2/2002 |
| JP | 2003-124329 A | 4/2003 |
| JP | 2011-40571 A | 2/2011 |
| JP | 2011-66284 A | 3/2011 |
| JP | 2012-227431 A | 11/2012 |
| JP | 2016-195160 A | 11/2016 |
| WO | 2002/003458 A1 | 1/2002 |

OTHER PUBLICATIONS

Written Opinion in the parent PCT application No. PCT/JP2017/016977, dated Jun. 27, 2017.

* cited by examiner

CAPACITOR DEVICE AND MANUFACTURING METHOD THEREFOR

TECHNICAL FIELD

The present invention relates to a capacitor device including one or a plurality of capacitor cells formed on a semiconductor substrate, and a manufacturing method thereof.

BACKGROUND ART

Description of the Related Art Capacitor devices that include one or more capacitor cells formed on a semiconductor substrate using semiconductor process technology are known. Such a capacitor device is required to satisfy various requirements such as an increase in capacity, a reduction in size, a reduction in manufacturing cost, and ease of design change.

Patent Document 1 discloses a trench capacitor having a structure formed in a direction perpendicular to the surface of a semiconductor substrate.

PRIOR ART DOCUMENTS

Patent Literature

Patent Document 1: U.S. Pat. No. 9,472,690

SUMMARY OF THE INVENTION

Problems to be Solved by the Invention

Capacitor devices are required to reduce the diameter and spacing of terminals (solder balls, etc.) and the thickness of the capacitor device for further circuit integration.

In the case of the trench capacitor as disclosed in Patent Document 1, since the trench capacitor is formed in the silicon substrate, when the surface of the silicon substrate is polished in the manufacturing process, it is necessary to polish so as to leave the capacitor portion. Therefore, the thickness (depth) of the silicon substrate that can be reduced by polishing is limited. In addition, the depth of trench capacitors is increasing with the miniaturization of semiconductor process technology, and there are trench capacitors having a depth exceeding 10 µm. Therefore, as the depth of the trench capacitor increases, the final capacitor device thickness also increases. Accordingly, there is a need for a capacitor device having a reduced thickness compared to the conventional one without being subject to such restrictions.

In addition, when manufacturing a capacitor device having characteristics such as different capacitance, different capacitance density (capacity per unit volume), different breakdown voltage, and/or different positions and number of terminals using semiconductor process technology. If so, it was necessary to remake the mask, which was very expensive. Accordingly, there is a need for a capacitor device that can be manufactured by changing the characteristics of the capacitor described above at a lower cost than before.

An object of the present invention is to provide a capacitor device including one or a plurality of capacitor cells formed on a semiconductor substrate and having a thickness reduced as compared with the conventional one.

Another object of the present invention is a capacitor device including one or a plurality of capacitor cells formed on a semiconductor substrate, which can be manufactured by changing the characteristics of the capacitor described above at a lower cost than in the past.

A further object of the present invention is to provide a method for manufacturing such a capacitor device.

Means for Solving the Problem

According to a first aspect of the present invention, a capacitor device, may comprise a plurality of capacitor cells formed on a rectangular semiconductor substrate having sides extending along a first direction and a second direction orthogonal to each other, the capacitor device comprising: a plurality of first electrodes, comprising a portion formed in a first layer of the semiconductor substrate, arranged in a first period in the first direction and in a second period in the second direction; a plurality of second electrodes, comprising a portion formed in a second layer different from the first layer of the semiconductor substrate, arranged in the first period in the first direction and in the second period in the second direction above the first electrodes and shifted by half the length of the first period in the first direction and half the length of the second period in the second direction with respect to the first electrodes, each pair of the first and second electrodes, partially opposed to each other and coupled capacitively to each other, forming a capacitor cell; a plurality of first cell terminals, comprising portions formed on a third layer different from the first and second layers of the semiconductor substrate, arranged in the first period in the first direction and in the second period in the second direction, and electrically connected to the first electrodes respectively; and a plurality of second cell terminals, comprising portions formed in the third layer of the semiconductor substrate, arranged in the first period in the first direction and in the second period in the second direction, and electrically connected to the plurality of second electrodes respectively; wherein the second layer is located between the first and third layers, each of the second cell terminals is disposed so as to be shifted by half the length of the first period in the first direction and half the length of the second period in the second direction, with respect to each of the first cell terminals.

According to a second aspect of the present invention, the capacitor device according to the first aspect may further comprise at least two external terminals, each of which is electrically connected to a portion of the first cell terminals and the plurality of second cell terminals.

According to a third aspect of the present invention, the capacitor device according to the second aspect may be featured by wherein the plurality of cell terminals extend in the first direction or the second direction, and form a plurality of cell terminal rows adjacent to each other in the extending direction, the capacitor device comprises first and second external terminals having a comb shape, each of the first and second external terminals is electrically connected to every 2N cell terminal rows of the plurality of cell terminal rows when N is an integer, a plurality of first portions connect to each other, and a second portion connects the first portions to each other, each of the first portions of the first external terminal and each of the first portions of the second external terminal is formed so as to be engaged with each other, and the N cell terminal rows of the plurality of cell terminal rows are arranged so as to be electrically connected to the first and second external terminals alternately.

According to a fourth aspect of the present invention, the capacitor device according to the second aspect may be featured by wherein the plurality of cell terminals extend in the first direction or the second direction, and form a plurality of cell terminal rows adjacent to each other in the extending direction, and the capacitor device comprises a first external terminal, having a fishbone shape; and second and third external terminals, each having a comb shape; wherein a plurality of first portions of the first external terminal electrically connect to the cell terminal rows at every 2N cell terminal row of the plurality of cell terminal rows and a second portion of the first external terminal connects the first portion to each other at the center of the first portions of the first external terminal; wherein every 2N cell terminal row of the plurality of cell terminal rows comprises a plurality of cell terminals a part of which electrically connects to a plurality of first portions of the second external terminal, a second portion of the second external terminal connects the first portions of the second external terminal to each other, and the second portion of the second external terminal is formed so as to be engaged with the first portion of the first external terminal on a first side with the second portion of the first external terminal as a reference; wherein every 2N cell terminal row of the plurality of cell terminal rows comprises a plurality of cell terminals a part of which electrically connects to a plurality of first portions of the third external terminal, a second portion of the third external terminal connects the first portions of the third external terminal to each other, and the second portion of the third external terminal is formed so as to be engaged with the first portion of the first external terminal on a second side opposite to the first side with the second portion of the first external terminal as a reference; and wherein every N cell terminal rows of the plurality of cell terminal rows is arrange so as to connect to the first external terminal and the second external terminal or the third external terminal alternately.

According to a fifth aspect of the present invention, the capacitor device according to the second aspect may be featured by wherein the plurality of cell terminals extend in the first direction or the second direction, and form a plurality of cell terminal rows adjacent to each other in the extending direction, the capacitor device comprises a external terminal having a meander shape and second and third external terminals each having a comb shape; wherein a plurality of first portions of the first external terminal electrically connect to the cell terminal rows at every 2N cell terminal row of the plurality of cell terminal rows and a second portion of the first external terminal connects the first portion to each other at one of both ends in the longitudinal direction of the first portions of the first external terminal; wherein every 4N cell terminal row of the plurality of cell terminal rows electrically connects to a plurality of first portions of the second external terminal, a second portion of the second external terminal connects the first portions of the second external terminal to each other, and the second portion of the second external terminal is formed so as to be engaged with the first portion of the first external terminal on a first side with the first external terminal as a reference; wherein every 4N cell terminal row of the plurality of cell terminal rows electrically connects to a plurality of first portions of the third external terminal, a second portion of the third external terminal connects the first portions of the third external terminal to each other, and the second portion of the third external terminal is formed so as to be engaged with the first portion of the first external terminal on a second side opposite to the first side with the first external terminal as a reference; and wherein every N cell terminal rows of the plurality of cell terminal rows is arrange so as to connect to the first external terminal and the second external terminal or the third external terminal alternately.

According to a sixth aspect of the present invention, a capacitor device according to the second aspect may be featured by wherein the plurality of cell terminals extend in the first direction or the second direction, and form a plurality of cell terminal rows adjacent to each other in the extending direction, the capacitor device comprises a plurality of external terminals which comprise first and second external terminals, each of the first and second external terminals of each set comprises a portion electrically connecting to at least one cell terminal row of the plurality of cell terminal rows, the cell terminal rows are arranged so that every 2N cell terminal row of the plurality of cell terminal rows electrically connects alternately to the first and second external terminals.

According to a seventh aspect of the present invention, a capacitor device according to one of the third to sixth aspects may be featured by wherein each of the external terminals is electrically connected to a circuit external to the capacitor device at a portion electrically connected to one of the plurality of cell terminal rows.

According to an eighth aspect of the present invention, a capacitor device according to one of the first to seventh aspects may be featured by wherein the semiconductor substrate has a first surface and a second surface, in the capacitor device, a first silicon oxide film is exposed on the first surface, a passivation film is exposed on the second surface, the first electrode, formed on the first silicon oxide film, comprises a plurality of stacked conductor films, the second electrode comprises a plurality of conductor films which are laminated, the capacitor device further comprises an insulating film formed between the first and second electrodes and a second silicon oxide film formed on the second electrode, the passivation film is formed on the silicon oxide film, the first and second cell terminals are exposed on the second surface, and the first electrode, the second electrode and the insulating film form on the capacitor cell.

According to a ninth aspect of the present invention, a capacitor device according to one of the first to eighth aspects may be featured by, wherein each of the capacitor cells is formed as a crown type stacked capacitor.

According to a tenth aspect of the present invention, a capacitor device comprising at least one capacitor cell formed on a semiconductor substrate having a first surface and a second surface, may comprise a first silicon oxide film, exposed on the first surface; a first electrode, formed on the first silicon oxide film, comprising a plurality of stacked conductor films; a second electrode, comprising a plurality of stacked conductor films; an insulating film, formed between the electrodes; a second silicon oxide film, formed on the second electrode; an exposed passivation film, formed on the second silicon oxide film and exposed to the second surface; at least one first cell terminal, electrically connected to the first electrode and exposed to the second surface; at least one second cell terminal, electrically connected to the second electrode and exposed to the second surface; and the first electrode, the second electrode and the insulating film form the capacitor cell.

According to an eleventh aspect of the present invention, a capacitor device according to the tenth aspect may be featured by wherein the capacitor cell is formed as a crown type stacked capacitor.

According to a twelfth aspect of the present invention, a capacitor device according to the tenth or eleventh aspect may be featured by wherein each of the first and second electrodes includes at least one metal film.

According to a thirteenth aspect of the present invention, a capacitor device according to one of the tenth to twelfth aspects may be featured by wherein the insulating layer comprises one or more of $Ta_2O_5$ based material, $Al_2O_3$ based material, $HfO_2$ based material, $ZrO_2$ based material, and $TiO_2$ based material.

According to a fourteenth aspect of the present invention, a capacitor device according to one of the tenth to thirteenth aspects may be featured by wherein each of the first cell terminals comprises a first pad conductor exposed to the second surface, and a first via conductor electrically connected to the first electrode from the first pad conductor, each second cell terminal comprises a second pad conductor exposed on the second surface, and a second via conductor electrically connected to the second electrode from the second pad conductor.

According to a fifteenth aspect of the present invention, a capacitor device according to one of the tenth to fourteenth aspects further comprise a plurality of capacitor cells stacked in a direction perpendicular to the first and second surfaces of the semiconductor substrate, the first cell terminal being connected to each first electrode of the plurality of capacitor cells, and the second cell terminal is connected to each second electrode of the plurality of capacitor cells.

According to a sixteenth aspect of the present invention, a manufacturing method of a capacitor device comprising a plurality of capacitor cells formed on a rectangular semiconductor substrate having sides extending along a first direction and a second direction orthogonal to each other may comprise steps of forming a plurality of first electrodes comprising a portion formed in a first layer of a semiconductor substrate, arranged in a first period in the first direction and a second period in the second direction; and forming a plurality of second electrodes comprising a portion formed in a second layer different from the first layer of the semiconductor substrate, arranged in the first period in the first direction and in the second period in the second direction; wherein the step of forming the second electrodes comprises arranging the second electrodes with shifting the first electrode by half the length of the first period in the first direction and half the length of the second period in the second direction; wherein each of the first electrodes and each of the second electrodes are partially opposed and capacitively coupled to each other, and each pair of the first and second electrodes capacitively coupled to each other forms a capacitor cell; the manufacturing method may comprise steps of: forming a plurality of first cell terminal comprising a portion formed in a third layer different from the first and second layers of the semiconductor substrate, arranged in the first period in the first direction and in the second period in the second direction, and forming a plurality of first cell terminals electrically connecting to the plurality of first electrodes, and forming a plurality of second cell terminals comprising a portion in the third layer of the semiconductor substrate, arranged in the first period in the first direction and in the second period in the second direction, and forming the plurality of second cell terminals electrically connecting to the plurality of second electrodes; wherein the second layer is disposed between the first and third layers; and wherein the step of forming the second cell terminals comprises arranging the second cell terminals with shifting the first cell terminals by half the length of the first period in the first direction and half the length of the second period in the second direction.

According to a seventeenth aspect of the present invention, a manufacturing method according to the sixteenth aspect may be characterized by a step of forming a plurality of external terminals, wherein at least one of the plurality of first cell terminals and the plurality of second cell terminals comprises a plurality of cell terminals a part of which are electrically connected to two of the external terminals.

According to an eighteenth aspect of the present invention, a manufacturing method according to the seventeenth aspect may further comprise steps of electrically connecting the external terminals to a circuit external to the capacitor device at a desired position to provide a desired capacitance and a desired breakdown voltage and a size of the capacitor device; selecting a first mask for forming a metal wiring used as a scribe line and a guard ring; selecting a second mask for forming the external terminals; and selecting a third mask for forming a cell terminal for connecting the metal wiring and the external terminals among the plurality of cell terminals.

According to a nineteenth aspect of the present invention, a manufacturing method of a capacitor device comprising at least one capacitor cell formed on a semiconductor substrate having a first surface and a second surface, may comprise steps of: forming a first silicon oxide film on a silicon substrate, and forming a first electrode comprising a plurality of stacked conductor films on the first silicon oxide film; forming an insulating film on the first electrode; forming a second electrode comprising a plurality of stacked conductor films on the insulating film; forming a second silicon oxide film on the second electrode; forming a passivation film on the second silicon oxide film; forming at least one first cell terminal electrically connected to the first electrode and exposed to the second surface; forming at least one second cell terminal electrically connected to the second electrode and exposed to the second surface;
removing the silicon substrate; and the first electrode, the second electrode and the insulating film form the capacitor cell.

According to a nineteenth aspect of the present invention, a manufacturing method according to the nineteenth aspect may further comprise steps of forming a plurality of capacitor cells stacked in a direction perpendicular to the first and second surfaces of the semiconductor substrate; connecting the first cell terminal to each first electrode of the plurality of capacitor cells; and connecting the second cell terminal to each second electrode of the plurality of capacitor cells.

The Invention's Effect

According to the present invention, it is possible to provide a capacitor device including one or a plurality of capacitor cells formed on a semiconductor substrate, the capacitor device having a thickness reduced as compared with the related art.

In addition, according to the present invention, a capacitor device including one or a plurality of capacitor cells formed on a semiconductor substrate, which can be manufactured by changing the characteristics of the capacitor described above at a lower cost than in the past.

Furthermore, according to the present invention, a method for manufacturing such a capacitor device can be provided.

BEST MODE FOR CARRYING OUT THE INVENTION

Hereinafter, embodiments of the present invention will be described with reference to the drawings.

First Embodiment

Figure 1:
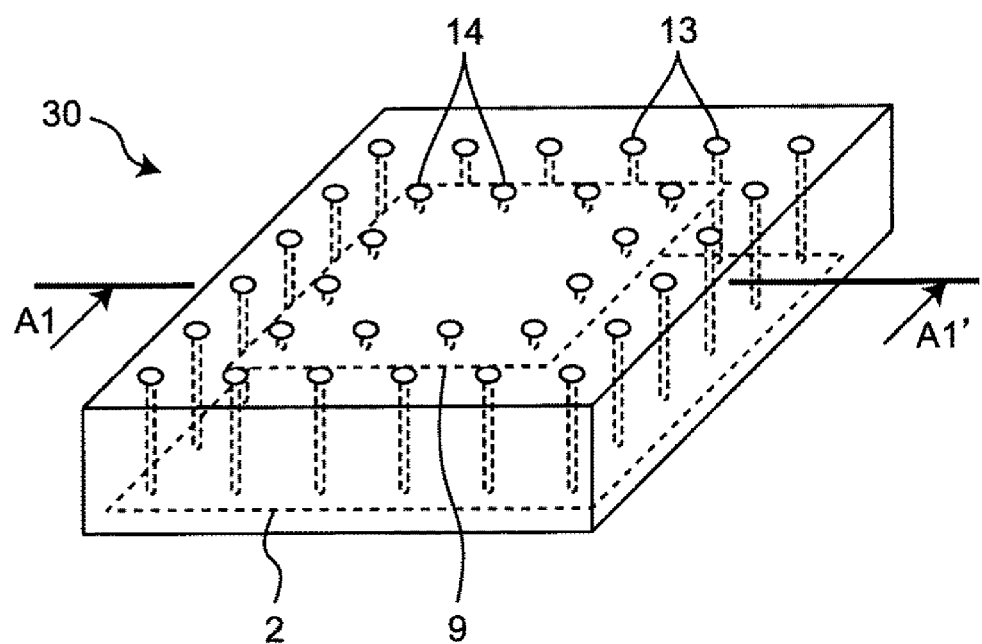
FIG. 1 is a perspective view showing a configuration of a capacitor device according to a first embodiment.

FIG. 1 is a perspective view showing the configuration of the capacitor device according to the first embodiment. The capacitor device of FIG. 1 includes a capacitor cell 30 formed on a semiconductor substrate having a first surface and a second surface. In the example of this specification, the lower surface of the capacitor device is a first surface, and the upper surface of the capacitor device is a second surface. The capacitor cell 30 includes a first electrode including the metal film 2, a second electrode including the metal film 9, and an insulating film (not shown in FIG. 1) formed between the first and second electrodes. In the example of the present specification, the first electrode including the metal film 2 is also referred to as a lower electrode, and the second electrode including the metal film 9 is also referred to as an upper electrode. The capacitor device is electrically connected to the lower electrode including the metal film 2 and electrically connected to at least one first cell terminal including the pad conductor 13 exposed on the upper surface of FIG. 1 and the upper electrode including the metal film 9. And at least one second cell terminal including a pad conductor 14 exposed on the upper surface shown in the figure. In the example of the present specification, the capacitor device includes a plurality of first cell terminals each including a pad conductor 13 and a plurality of second cell terminals each including a pad conductor 14.

Figure 2:
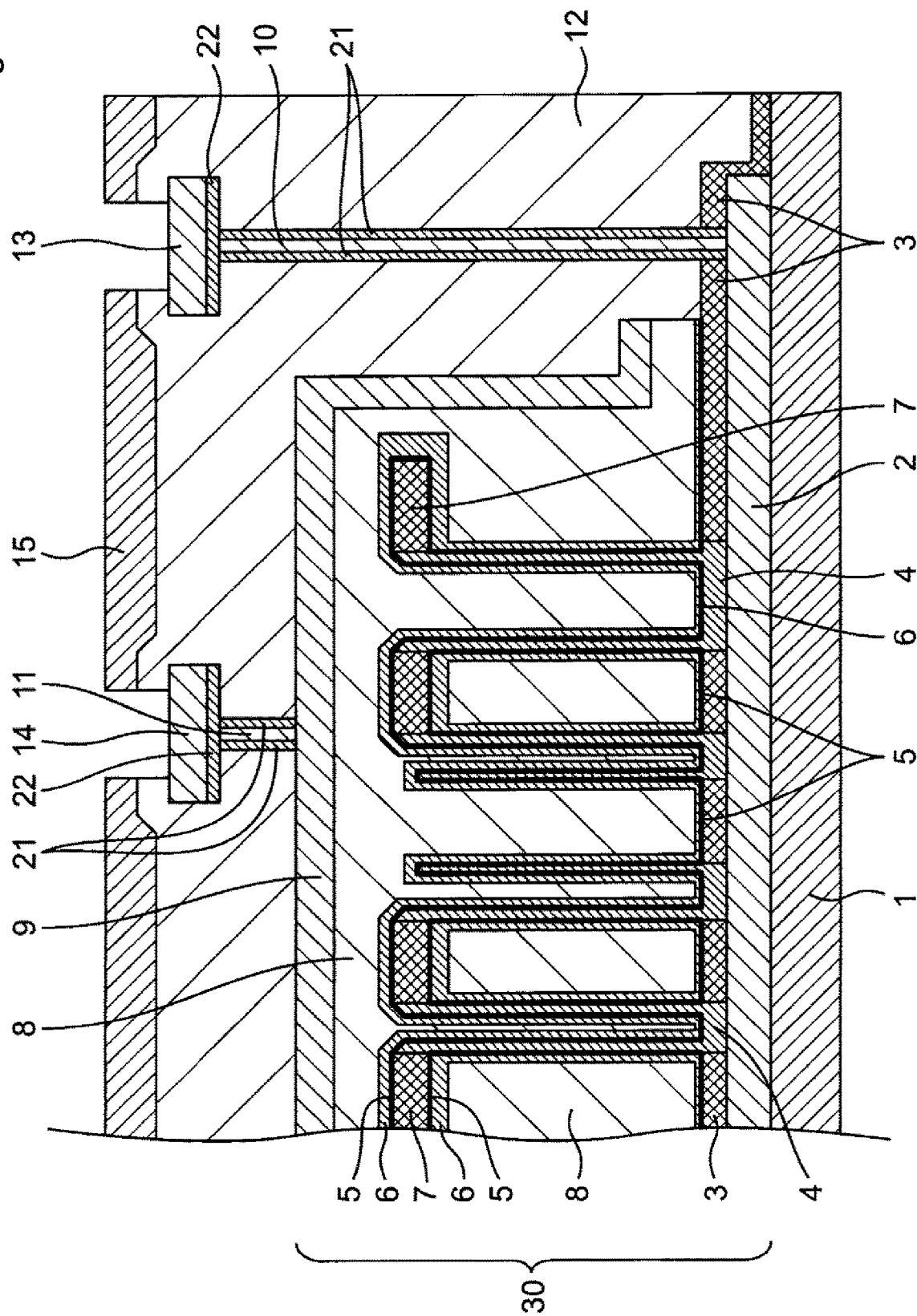
FIG. 2 is a diagram showing a part of a longitudinal section taken along line A1-A1' of the capacitor device of FIG. 1.

FIG. 2 is a diagram showing a part of a longitudinal section taken along the line A1-A1' of the capacitor device of FIG. 1.

The capacitor device includes an oxide film 1 exposed on the lower surface. In this specification, the oxide film 1 is also referred to as a first silicon oxide film.

The capacitor device is formed on the oxide film 1 and formed between a lower electrode including a plurality of stacked conductor films, an upper electrode including a plurality of stacked conductor films, and the lower electrode and the upper electrode. The insulating film 5 is provided.

The lower electrode includes a metal film 2 made of tungsten and a conductor film 4 made of Ti—TiN as conductor films. The metal film 2 and the conductor film 4 are electrically connected to each other and function as an integrated lower electrode. The conductor film 4 functions as a barrier metal. The lower electrode further includes a nitride film 3.

The upper electrode includes a conductor film 6 made of Ti—TiN, doped silicon 8 and a metal film 9 made of tungsten as conductor films. The doped silicon 8 fills the hollow space of the crown type stack capacitor with good coverage and improves its mechanical strength. As the doped silicon 8, a boron-doped silicon germanium film may be used. The conductor film 6, the doped silicon 8, and the metal film 9 are electrically connected to each other and function as an integral upper electrode. The upper electrode further includes a nitride film 7.

The insulating film 5 is made of, for example, a high dielectric material. The insulating film 5 includes, as a high dielectric material, for example, one or more of $Ta_2O_5$ material, $Al_2O_3$ material, $HfO_2$ material, $ZrO_2$ material, and $TiO_2$ material.

The lower electrode, the upper electrode, and the insulating film 5 form a capacitor cell 30. Since each of the lower electrode and the upper electrode includes at least one metal film 2 and 9, the capacitor cell 30 is formed as an MIM (Metal-Insulator-Metal) capacitor. The capacitor cell 30 is formed as a crown type stack capacitor as shown in FIG. 2.

The capacitor device includes an interlayer oxide film 12 formed on the metal film 9 of the upper electrode. In this specification, the interlayer oxide film 12 is also referred to as a second silicon oxide film. The capacitor device includes a passivation film 15 formed on the interlayer oxide film 12 and exposed on the upper surface. The passivation film 15 functions as a protective film that protects the upper surface of the capacitor device.

The capacitor device is electrically connected to the metal film 2 of the lower electrode and is at least one first cell terminal exposed on the upper surface and electrically connected to the metal film 9 of the upper electrode and exposed at least on the upper surface. One second cell terminal. Each first cell terminal includes a pad conductor 13 exposed on the upper surface and a via conductor 10 electrically connected from the pad conductor 13 to the metal film 2 of the lower electrode. In this specification, the pad conductor 13 is also referred to as a first pad conductor, and the via conductor 10 is also referred to as a first via conductor. Each second cell terminal includes a pad conductor 14 exposed on the upper surface and a via conductor 11 electrically connected from the pad conductor 14 to the metal film 9 of the upper electrode. In this specification, the pad conductor 14 is also referred to as a second pad conductor, and the via conductor 11 is also referred to as a second via conductor. A barrier metal 21 is formed around the via conductors 10 and 11, and a barrier metal 22 is formed on the lower surfaces of the pad conductors 13 and 14.

Figure 3:
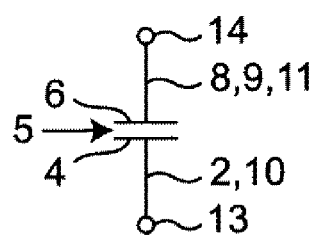
FIG. 3 is a circuit diagram showing an equivalent circuit of the capacitor device of FIG. 2.

FIG. 3 is a circuit diagram showing an equivalent circuit of the capacitor device of FIG. 2. The conductor films 4 and 6 are capacitively coupled to each other through the insulating film 5. The conductor film 4 is electrically connected to the pad conductor 13 through the metal film 2 and the via conductor 10. The conductor film 6 is electrically connected to the pad conductor 14 via the doped silicon 8, the metal film 9, and the via conductor 11. Thereby, the capacitor device functions as a capacitor.

Next, a manufacturing process of the capacitor device of FIG. 1 will be described with reference to FIG. 4 to FIG. 13.

Figure 4:
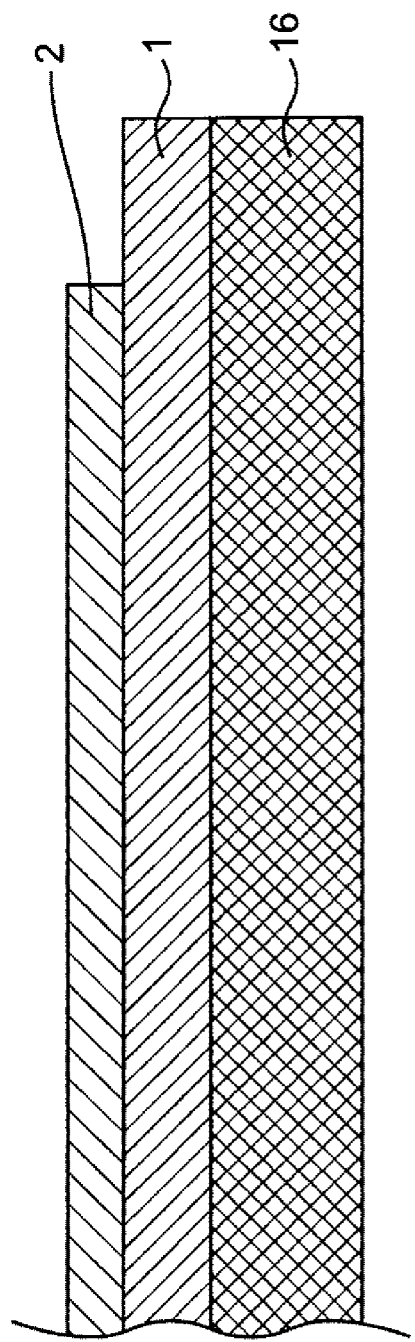
FIG. 4 is a cross-sectional view showing a first state in the manufacturing process of the capacitor device of FIG. 1.

FIG. 4 is a cross-sectional view showing a first state in the manufacturing process of the capacitor device of FIG. 1. FIG. 4 shows a state in which the oxide film 1 and the metal film 2 are formed on the silicon substrate 16 and patterned with a resist mask (not shown). In order to form the oxide film 1 and the metal film 2 on the silicon substrate 16, a conventional method can be used. For example, in order to form the oxide film 1, a thermal oxide film having a high film density may be used as a material that can withstand the mechanical strength at the time of back surface polishing described later.

Figure 5:
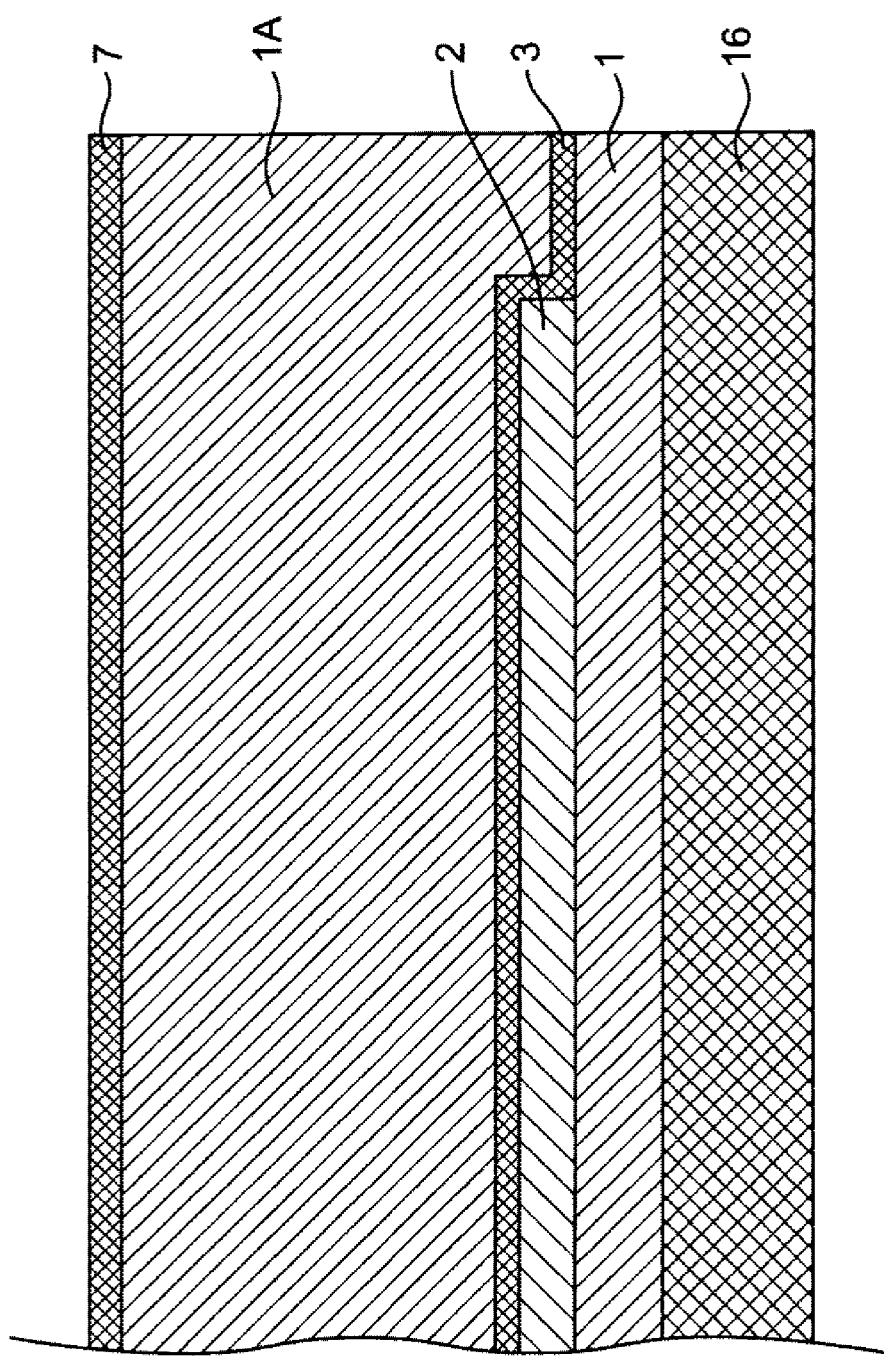
FIG. 5 is a cross-sectional view showing a second state in the manufacturing process of the capacitor device of FIG. 1.

FIG. 5 is a cross-sectional view showing a second state in the manufacturing process of the capacitor device of FIG. 1. FIG. 5 shows a state where the nitride film 3, another oxide film 1A, and the nitride film 7 are formed after the oxide film 1 and the metal film 2 are formed. Prior art methods can be used to form nitride film 3, another oxide film 1A, and nitride film 7. The nitride film 7 is formed in order to prevent the crown-type stacked capacitor electrode from falling down in a later step.

Figure 6:
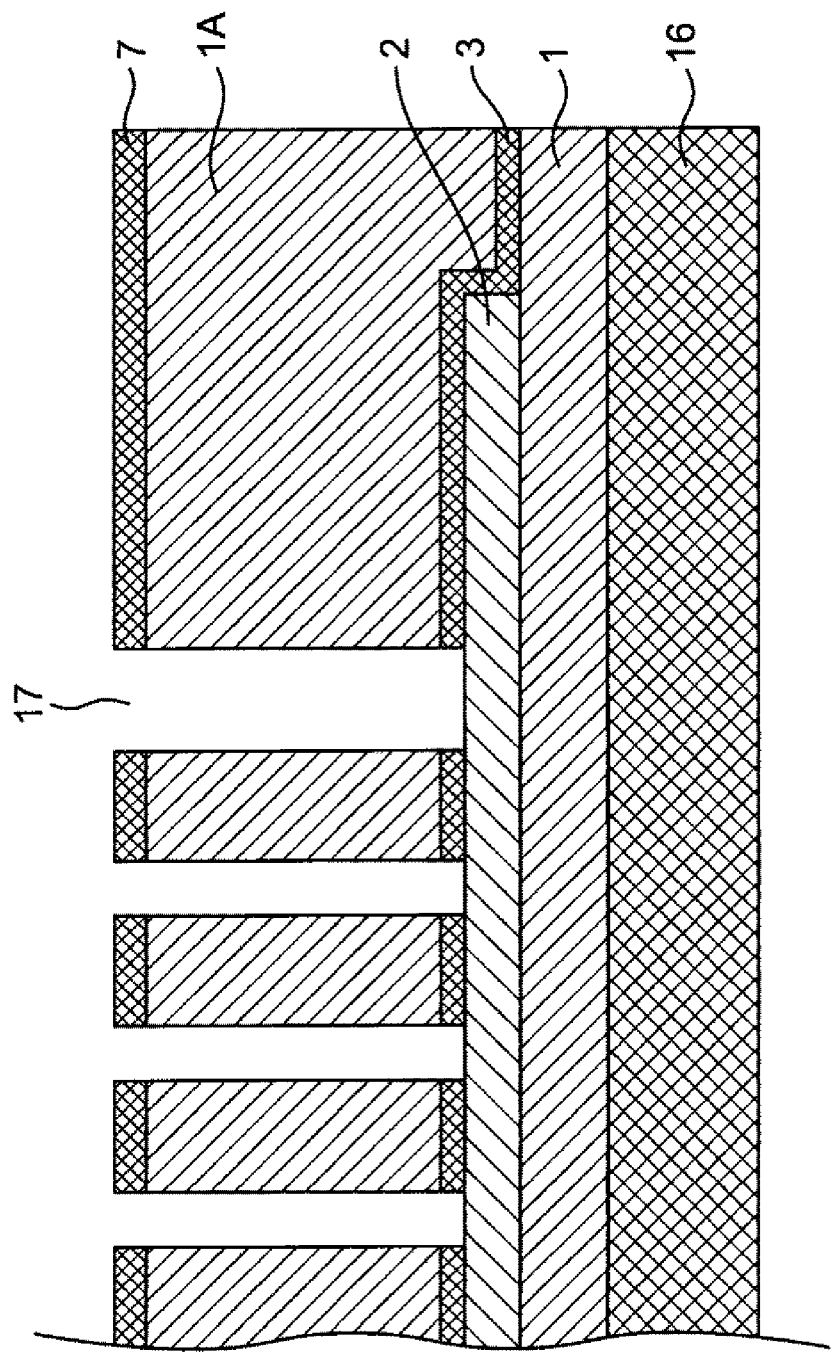
FIG. 6 is a cross-sectional view showing a third state in the manufacturing process of the capacitor device of FIG. 1.

FIG. 6 is a cross-sectional view showing a third state in the manufacturing process of the capacitor device of FIG. 1. FIG. 6 shows a state in which the nitride film 7, the oxide film 1A, and the nitride film 3 are patterned and etched to form an opening 17 for the stack capacitor. Prior art methods can be used to pattern and etch the nitride film 7, the oxide film 1A, and the nitride film 3.

Figure 7:
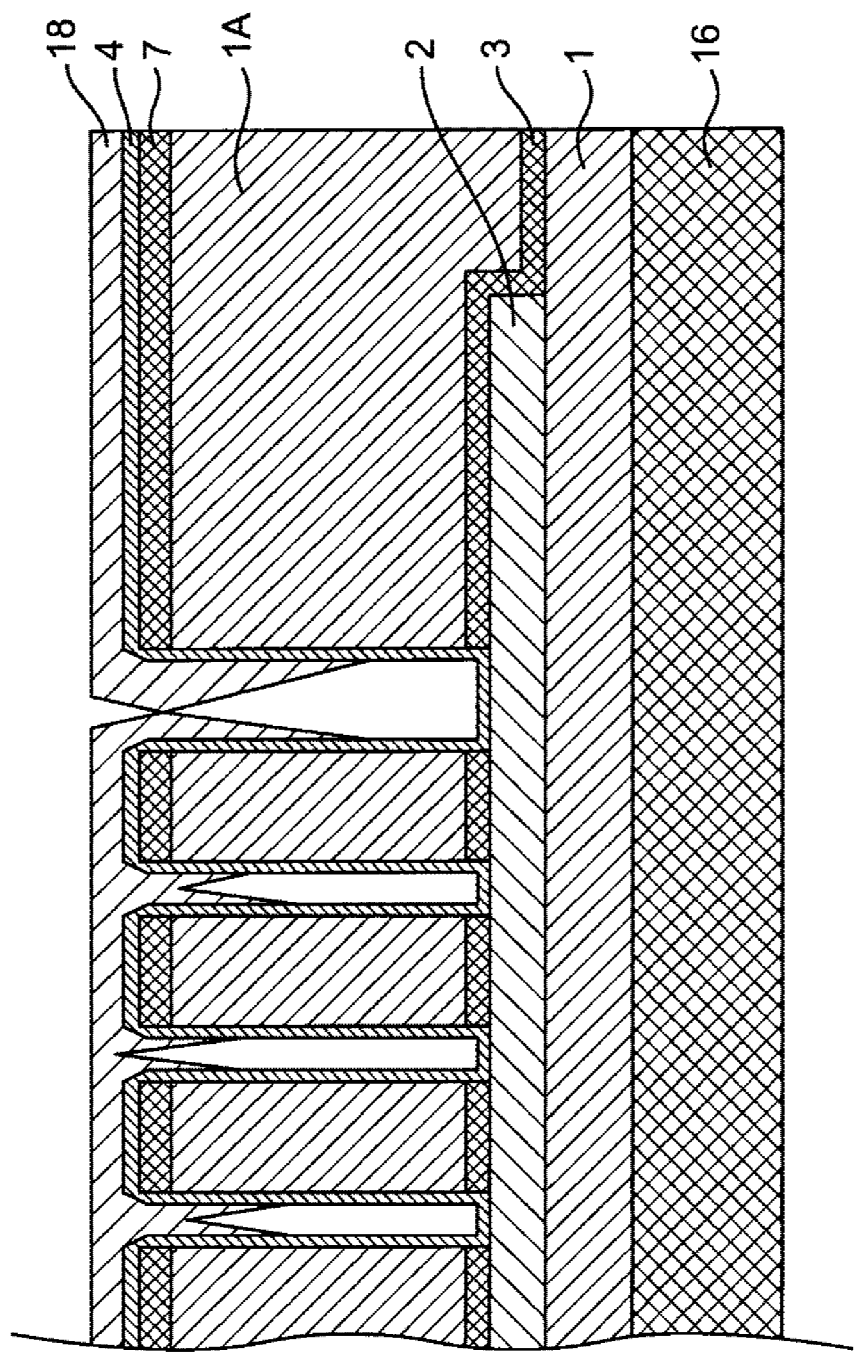
FIG. 7 is a cross-sectional view showing a fourth state in the manufacturing process of the capacitor device of FIG. 1.

FIG. 7 is a cross-sectional view showing a fourth state in the manufacturing process of the capacitor device of FIG. 1. FIG. 7 shows a state in which the conductor film 4 is formed and the oxide film 18 is further formed. Prior art methods can be used to form the conductor film 4 and the oxide film 18.

Figure 8:
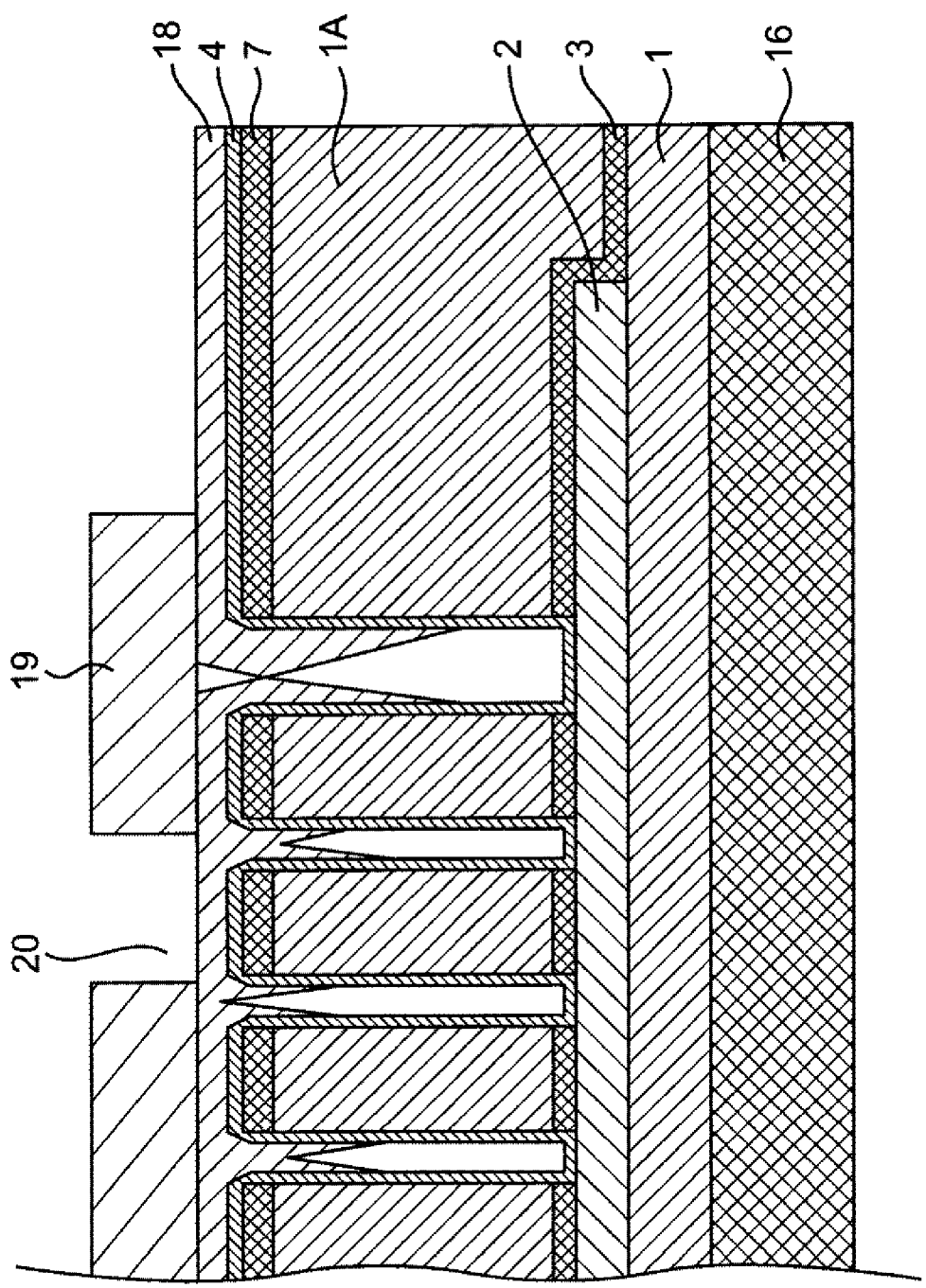
FIG. 8 is a cross-sectional view showing a fifth state in the manufacturing process of the capacitor device of FIG. 1.

FIG. 8 is a sectional view showing a fifth state in the manufacturing process of the capacitor device of FIG. 1. FIG. 8 shows a state in which the opening 20 for forming the crown type stack capacitor is patterned by the photoresist 19.

Figure 9:
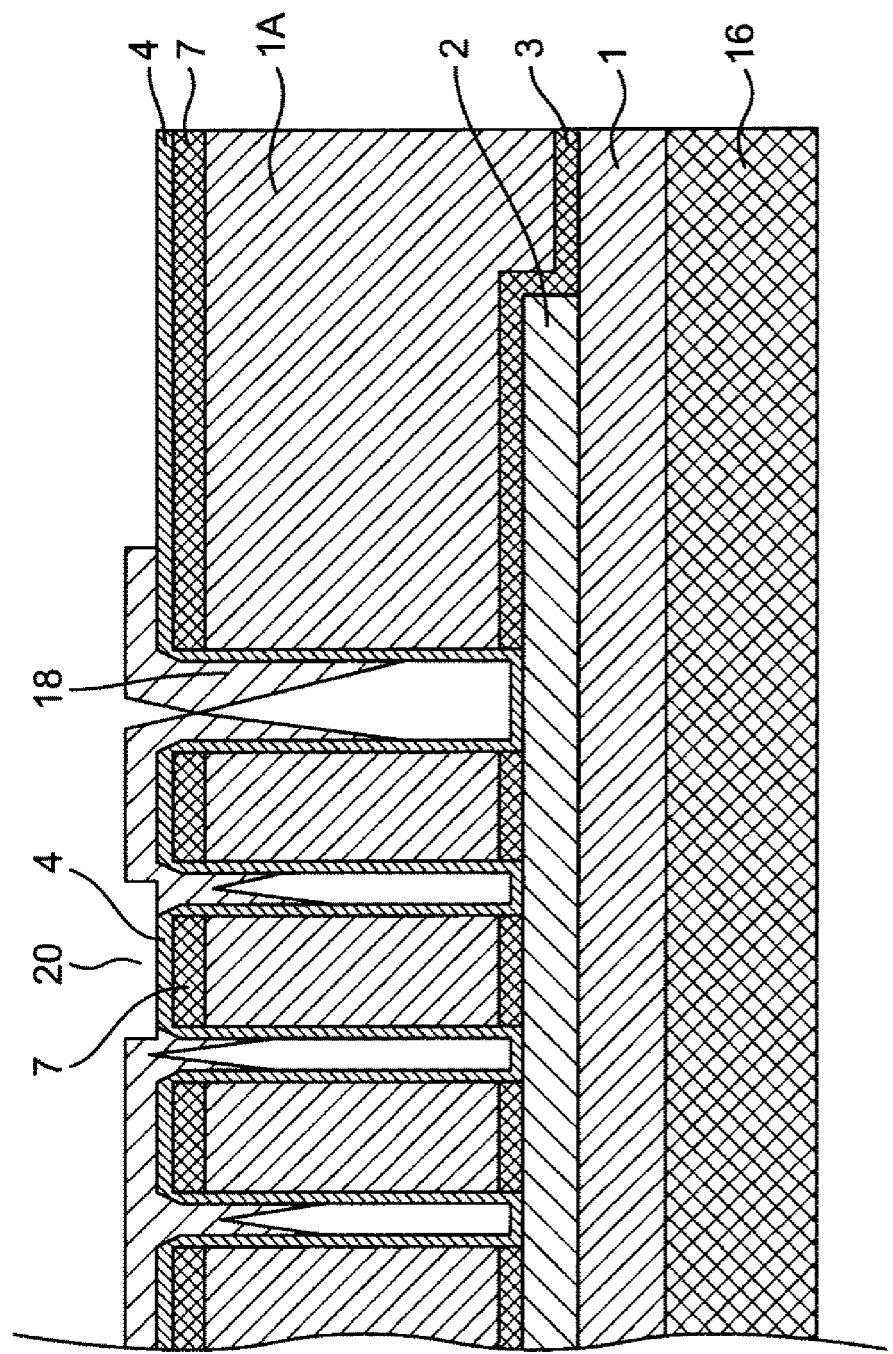
FIG. 9 is a cross-sectional view showing a sixth state in the manufacturing process of the capacitor device of FIG. 1.

FIG. 9 is a sectional view showing a sixth state in the manufacturing process of the capacitor device of FIG. 1. FIG. 9 shows a state in which the photoresist 19 is removed after the oxide film 18 in the opening 20 is etched. Thereafter, the conductor film 4 and the nitride film 7 in the opening 20 are etched using the oxide film 18 as a mask (not shown). At this time, the oxide film 18 and the conductor film 4 serving as a mask are also removed in a self-aligned manner, and a remaining structure of the conductor film 4 forms a crown-shaped structure. Even if the conductor film 4 that becomes a mask remains after etching, it can be removed by performing additional etching only on the conductor film 4.

Figure 10:
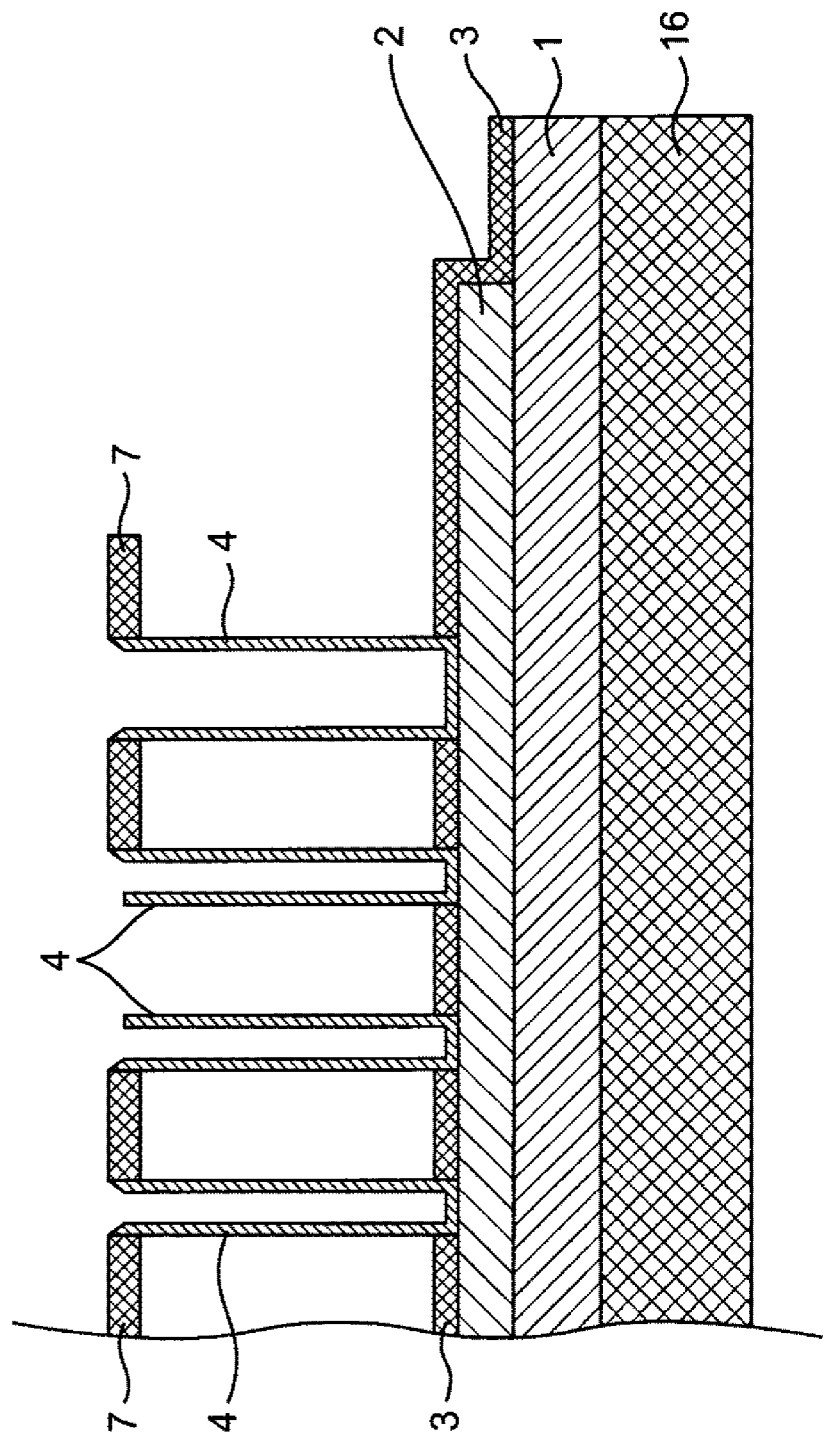
FIG. 10 is a cross-sectional view showing a seventh state in the manufacturing process of the capacitor device of FIG. 1.

FIG. 10 is a sectional view showing a seventh state in the manufacturing process of the capacitor device of FIG. 1. FIG. 10 shows a state in which the oxide film 1A remaining immediately under the side wall of the conductor film 4 and the nitride film 7 is removed from the opening formed at the position of the opening 20 in FIG. 9 by a wet process. As a result, a lower electrode including the metal film 2 and the conductor film 4 as a plurality of stacked conductor films is formed on the oxide film 1.

Figure 11:
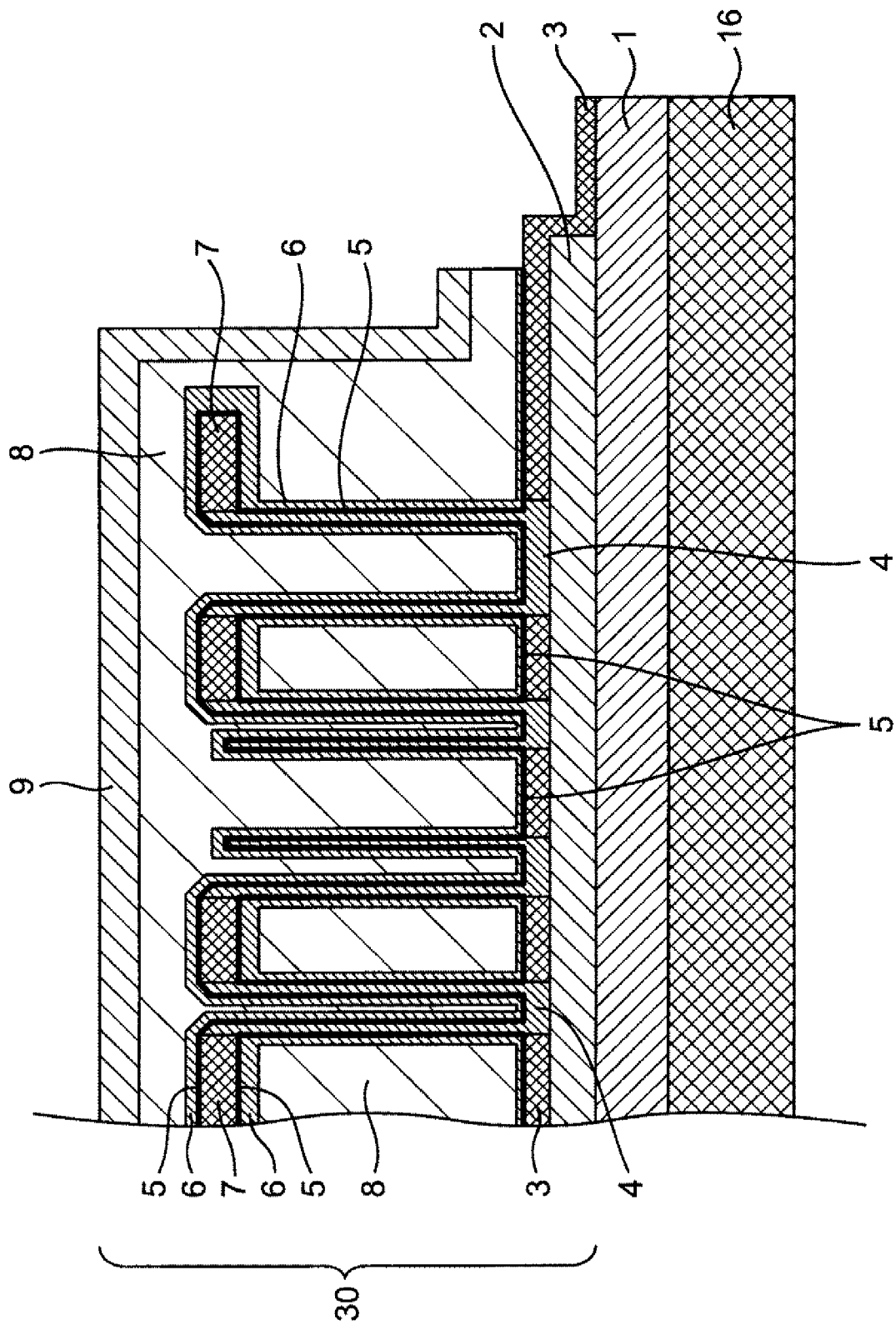
FIG. 11 is a cross-sectional view showing an eighth state in the manufacturing process of the capacitor device of FIG. 1.

FIG. 11 is a sectional view showing an eighth state in the manufacturing process of the capacitor device of FIG. 1. In FIG. 11, the insulating film 5 is formed on the conductor film 4, and the conductor film 6, the doped silicon 8, and the metal film 9 are sequentially formed on the insulating film 5, and then the insulating film 5, the doped silicon is formed. 8 and the metal film 9 are patterned by etching. In order to pattern the insulating film 5, the doped silicon 8, and the metal film 9 by etching, a conventional method can be used. Thereby, the insulating film 5 is formed on the lower electrode, and the upper electrode including the conductor film 6, the doped silicon 8, and the metal film 9 is formed on the insulating film 5 as a plurality of stacked conductor films. Is done.

Figure 12:
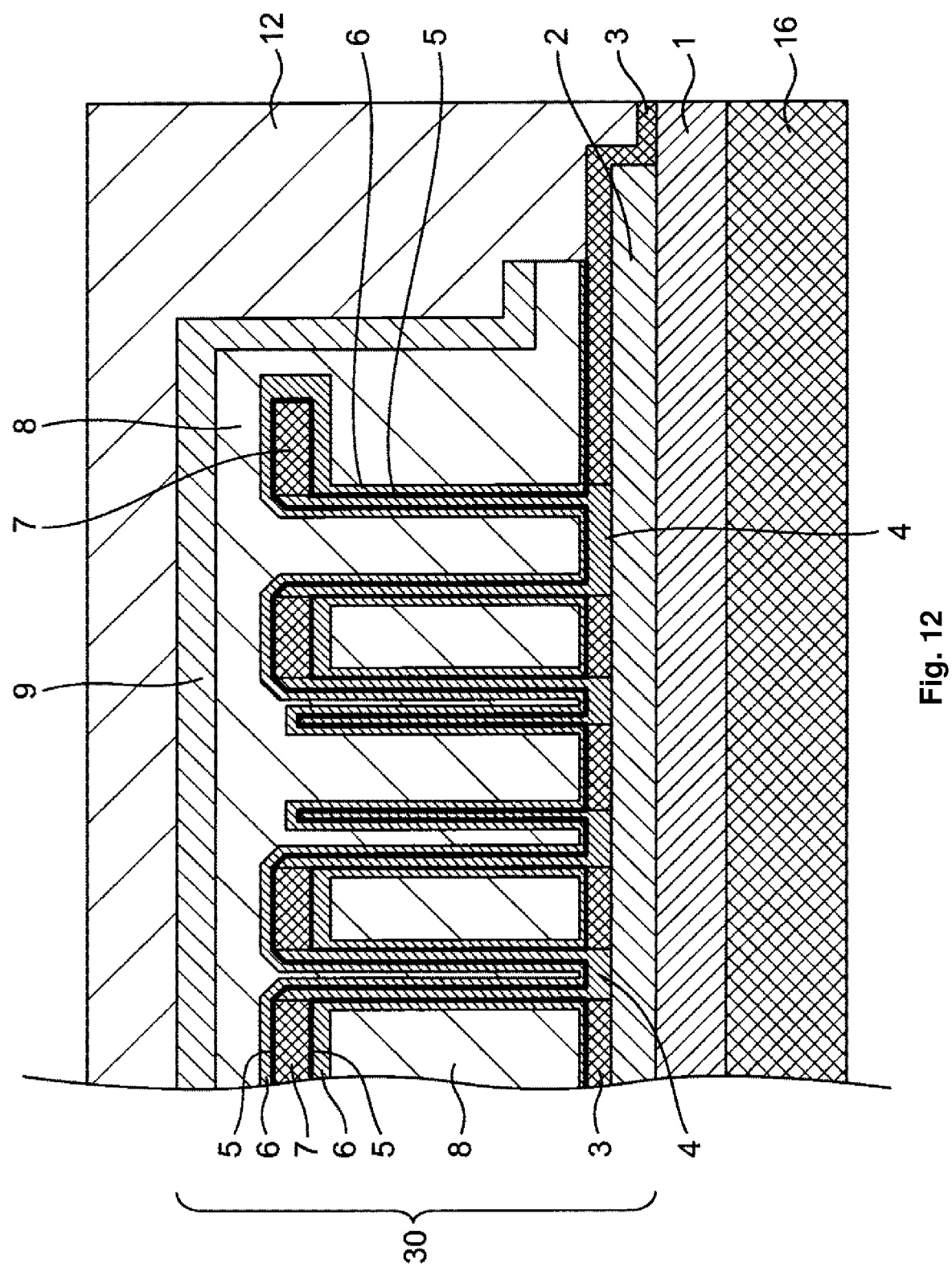
FIG. 12 is a cross-sectional view showing a ninth state in the manufacturing process of the capacitor device of FIG. 1.

FIG. 12 is a cross-sectional view showing a ninth state in the manufacturing process of the capacitor device of FIG. 1.

FIG. 12 shows a state in which an interlayer oxide film 12 is formed and planarized on the nitride film 3 and the metal film 9 of the upper electrode. Prior art methods can be used to form and planarize the interlayer oxide film 12. The planarization may be performed using a chemical mechanical polishing technique, may be performed by removing only the oxide film on the convex portion by patterning and etching, or a combination thereof.

Figure 13:
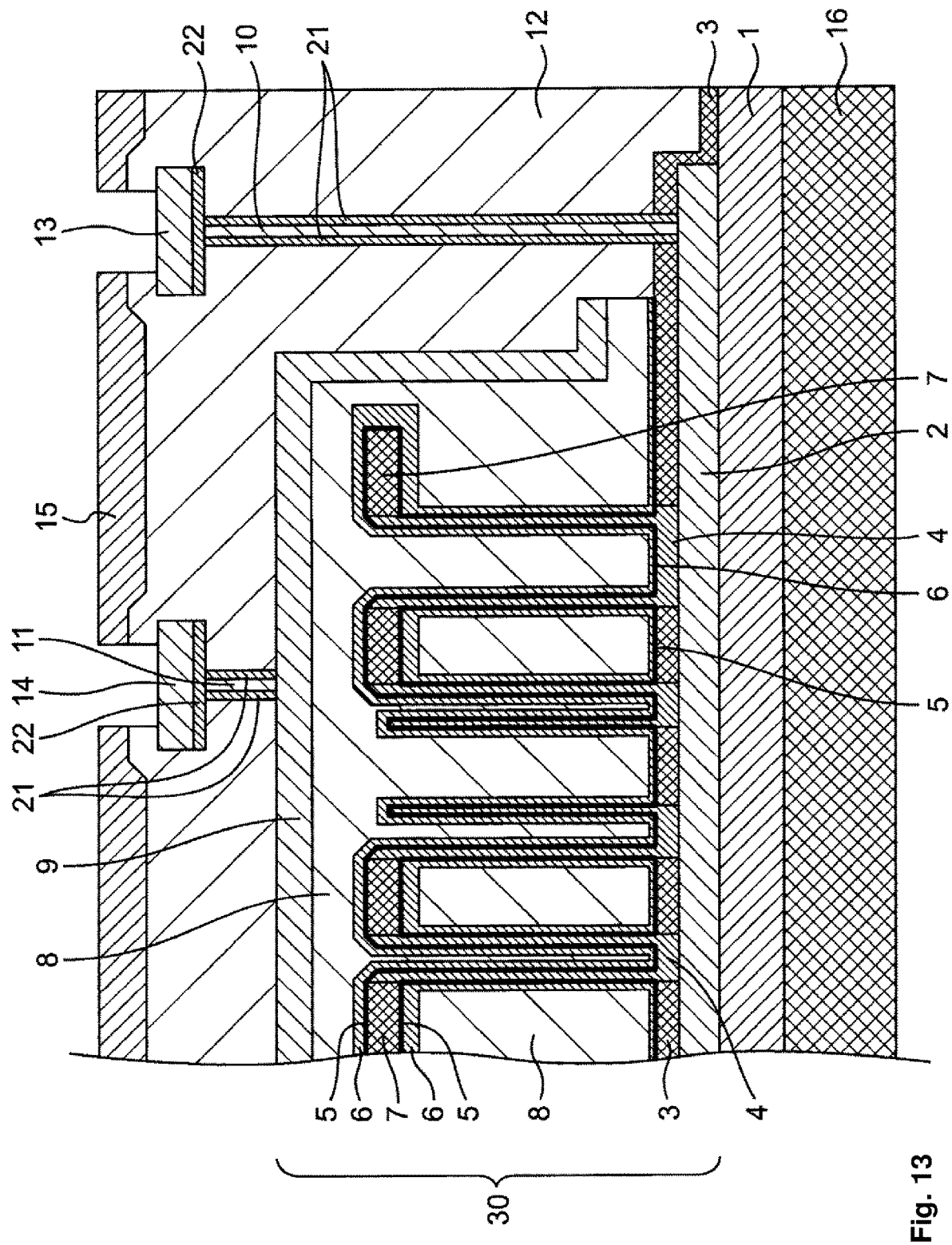
FIG. 13 is a cross-sectional view showing a tenth state in the manufacturing process of the capacitor device of FIG. 1.

FIG. 13 is a cross-sectional view showing a tenth state in the manufacturing process of the capacitor device of FIG. 1. In FIG. 13, via conductors 10 and 11 penetrating the interlayer oxide film 12 are formed, pad conductors 13 and 14 are formed on the interlayer oxide film 12, and a passivation film 15 is formed on the interlayer oxide film 12. Shows the state. In the passivation film 15, openings are formed only in the portions of the pad conductors 13 and 14. Prior art methods can be used to form via conductors 10 and 11. The via conductor 10 and the pad conductor 13 are electrically connected to the metal film 2 of the lower electrode and form at least one first cell terminal exposed on the upper surface. The via conductor 11 and the pad conductor 14 are electrically connected to the metal film 9 of the upper electrode and form at least one second cell terminal exposed on the upper surface. A barrier metal 21 is formed around the via conductors 10 and 11, and a barrier metal 22 is formed on the lower surfaces of the pad conductors 13 and 14.

Thereafter, the silicon substrate 16 is removed by backside polishing, whereby the capacitor device of FIG. 2 is completed.

Since the capacitor device according to the first embodiment does not use a silicon substrate in the portion of the capacitor cell 30, the capacitor device operates normally even if the silicon substrate 16 is removed by backside polishing. By removing the silicon substrate 16, the thickness of the capacitor device can be reduced as compared with the conventional case. The total thickness of the capacitor device according to the first embodiment can be reduced to about 4 to 5 µm when configured as a MIM crown type stack capacitor.

Further, as the structure of the stack capacitor, a concave (Concaved) stack MIM capacitor according to the prior art may be adopted.

An advantage of the MIM capacitor is that the desired capacitance can be secured without increasing the thickness of the capacitor device due to the effect of the high dielectric constant of the insulating film.

For example, by forming the MIM capacitor using a semiconductor process technology such as a general-purpose DRAM, it is possible to realize high density, thinning, and low cost. In general-purpose DRAM semiconductor process technology, a capacitor can be formed without using a structure formed below the surface of a silicon substrate like a trench capacitor, and is very suitable for thinning the capacitor device itself. Furthermore, process development costs can be reduced by diverting general-purpose DRAM semiconductor process technology.

Second Embodiment

Figure 14:
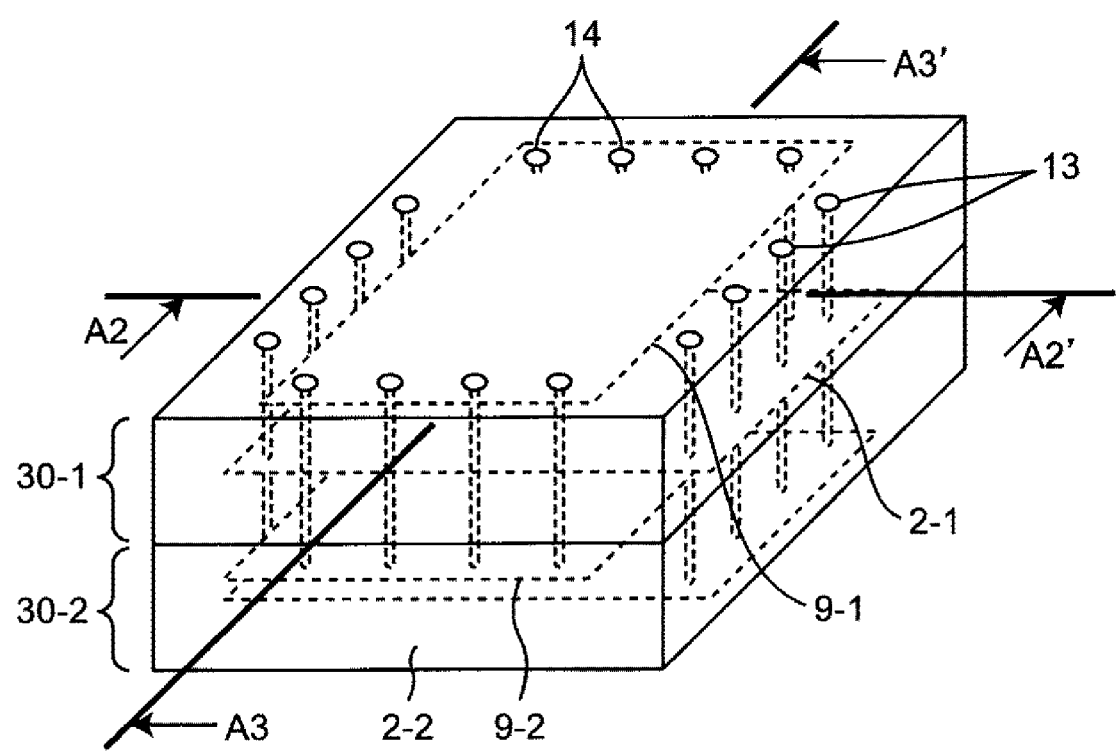
FIG. 14 is a perspective view showing a configuration of a capacitor device according to a second embodiment.

FIG. 14 is a perspective view showing the configuration of the capacitor device according to the second embodiment. The capacitor device of FIG. 14 is configured similarly to the capacitor cell 30 of the capacitor device according to the first embodiment, and a plurality of capacitor cells 30-1 stacked in a direction perpendicular to the lower surface and the upper surface of the semiconductor substrate. And 30-2.

At least one first cell terminal including the pad conductor 13 is electrically connected to the lower electrode including the metal film 2-1 in the capacitor cell 30-1, and further, the metal film 2 in the capacitor cell 30-2. 2 is electrically connected to the lower electrode. At least one second cell terminal including the pad conductor 14 is electrically connected to the upper electrode including the metal film 9-1 in the capacitor cell 30-1, and further, the metal film 9-2 in the capacitor cell 30-2.

Figure 15:
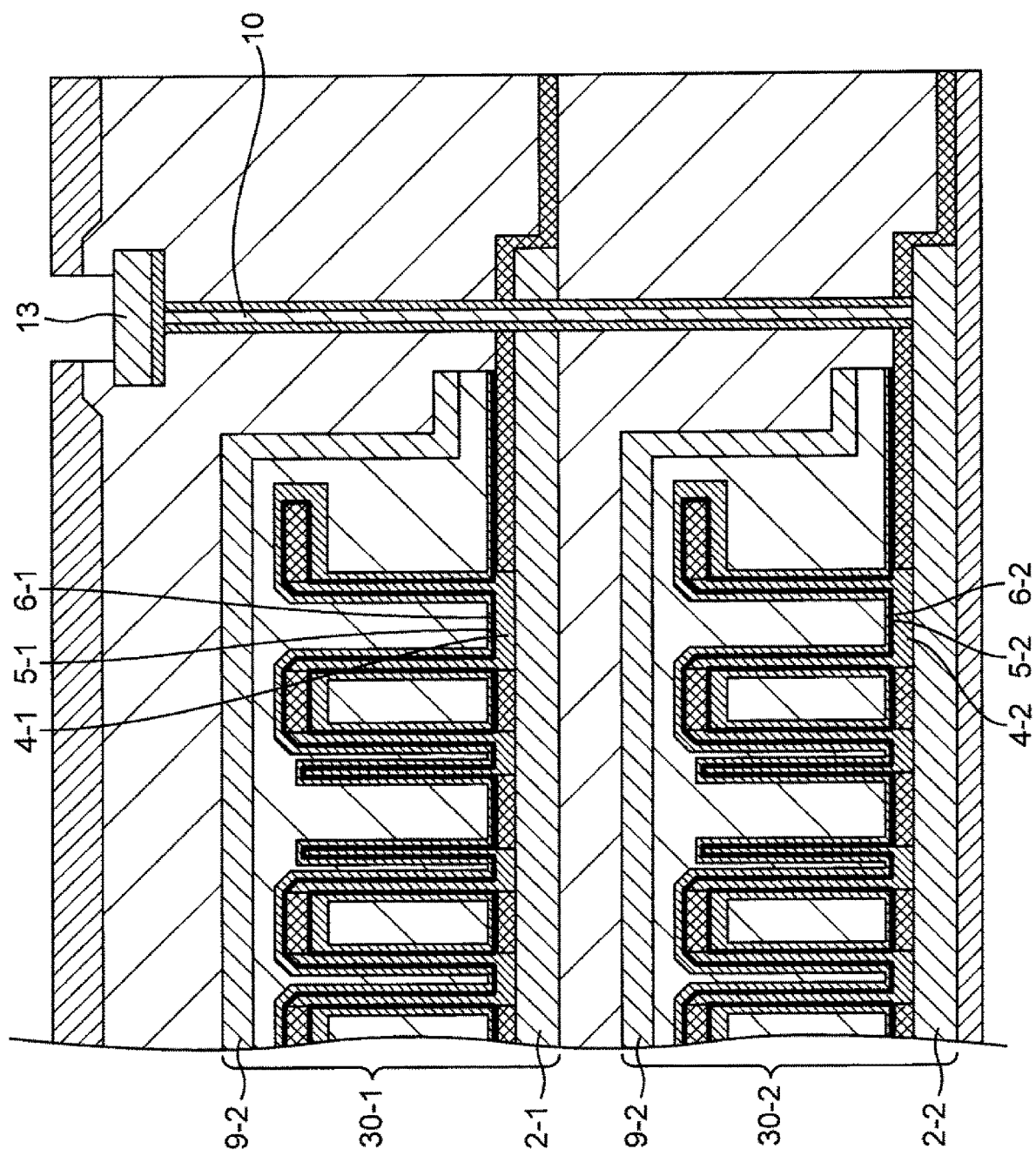
FIG. 15 is a diagram showing a part of a longitudinal section taken along line A2-A2' of the capacitor device of FIG. 12.
Figure 16:
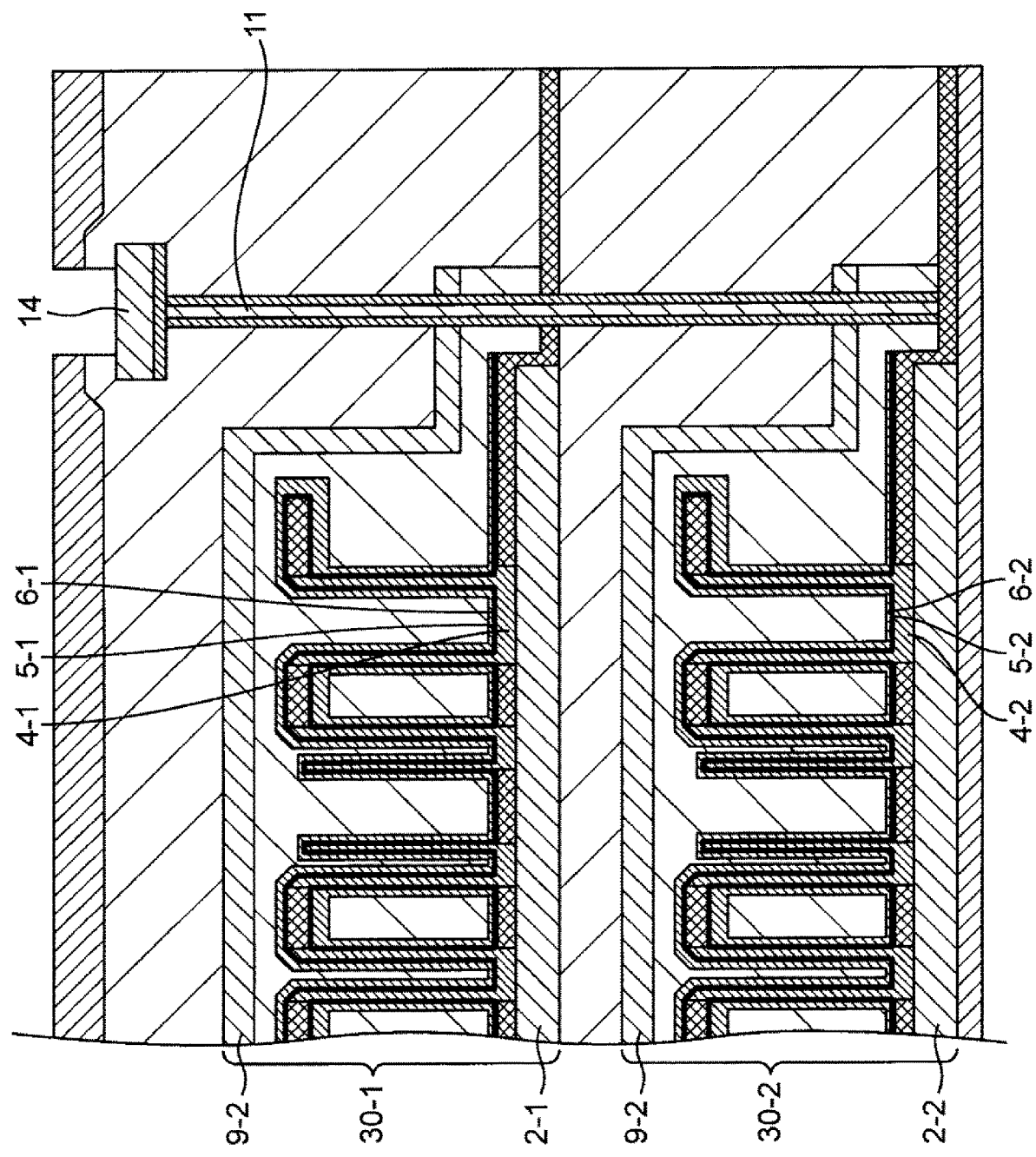
FIG. 16 is a diagram showing a part of a longitudinal section taken along line A3-A3' of the capacitor device of FIG. 13.

FIG. 15 is a view showing a part of a longitudinal section taken along line A2-A2' of the capacitor device of FIG. 14. FIG. 16 is a view showing a part of a longitudinal section taken along line A3-A3' of the capacitor device of FIG. 14. The capacitor device of FIG. 14 forms the capacitor cell 30 in FIG. 11, forms the interlayer oxide film 12 in FIG. 12 and planarizes the upper surface, and then repeats the steps described with reference to FIG. 4 to FIG. 12. Repeatedly, another capacitor cell 30 is formed. Thus, a plurality of capacitor cells 30-1 and 30-2 are formed that are stacked in a direction perpendicular to the lower surface and the upper surface of the semiconductor substrate. After forming the second capacitor cell 30, the silicon substrate 16 is removed by backside polishing. Next, the via conductor 10 is electrically connected to the metal film 2-1 of the lower electrode in the capacitor cell 30-1, and further electrically connected to the metal film 2-2 of the lower electrode in the capacitor cell 30-2. It is formed to be connected. Accordingly, the first cell terminal including the via conductor 10 and the pad conductor 13 is connected to the lower electrodes of the plurality of capacitor cells 30-1 and 30-2. Via conductor 11 is electrically connected to metal film 9-1 of the upper electrode in capacitor cell 30-1, and is further electrically connected to metal film 9-2 of the upper electrode in capacitor cell 30-2. Accordingly, the second cell terminal including the via conductor 11 and the pad conductor 14 is connected to the upper electrodes of the plurality of capacitor cells 30-1 and 30-2.

Figure 17:
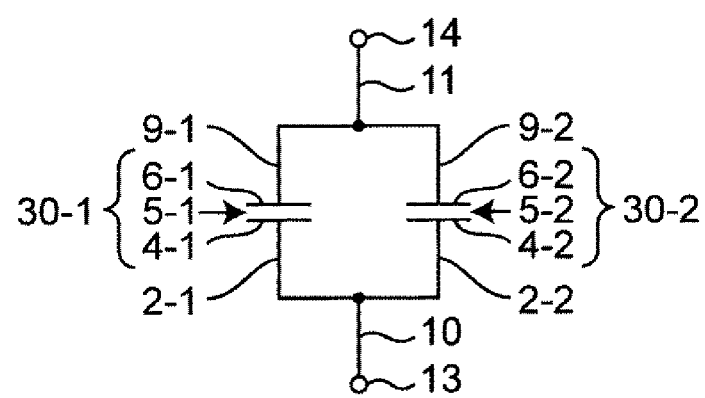
FIG. 17 is a circuit diagram showing an equivalent circuit of the capacitor device of FIGS. 15 and 16.

FIG. 17 is a circuit diagram showing an equivalent circuit of the capacitor device of FIGS. 15 and 16. In the capacitor cell 30-1, the conductor films 4-1 and 6-1 are capacitively coupled to each other through the insulating film 5-1. The conductor film 4-1 is electrically connected to the pad conductor 13 through the metal film 2-1 and the via conductor 10. The conductor film 6-1 is electrically connected to the pad conductor 14 via doped silicon (not shown), the metal film 9-1, and the via conductor 11. Similarly, in the capacitor cell 30-2, the conductor films 4-2 and 6-2 are capacitively coupled to each other through the insulating film 5-2. The conductor film 4-2 is electrically connected to the pad conductor 13 through the metal film 2-2 and the via conductor 10. The conductor film 6-2 is electrically connected to the pad conductor 14 via doped silicon (not shown), the metal film 9-2, and the via conductor 11. Thereby, the capacitor cells 30-1 and 30-2 are connected in parallel between the pad conductors 13 and 14.

In the capacitor device according to the second embodiment, the capacitor cells 30-1 and 30-2 are stacked and connected in parallel, so that the area of the capacitor cell in the horizontal direction is not increased. The capacity can be doubled.

By repeating the steps of FIGS. 4 to 13 and stacking three or more capacitor cells and connecting them in parallel, it is possible to increase the capacitance three times or more compared to the case of the first embodiment. In that case, the via conductors 10 and 11 may be formed using, for example, a conventional TSV (Through Si Via) technique.

Also in the capacitor device according to the second embodiment, the thickness of the capacitor device can be reduced as compared with the conventional case by removing the silicon substrate, similarly to the capacitor device according to the first embodiment. The total thickness of the capacitor device according to the second embodiment is only about 6 to 7 μm when configured as a MIM crown type stack capacitor.

The capacitor device according to the second embodiment also has other advantages similar to those of the capacitor device according to the first embodiment.

Third Embodiment

Figure 18:
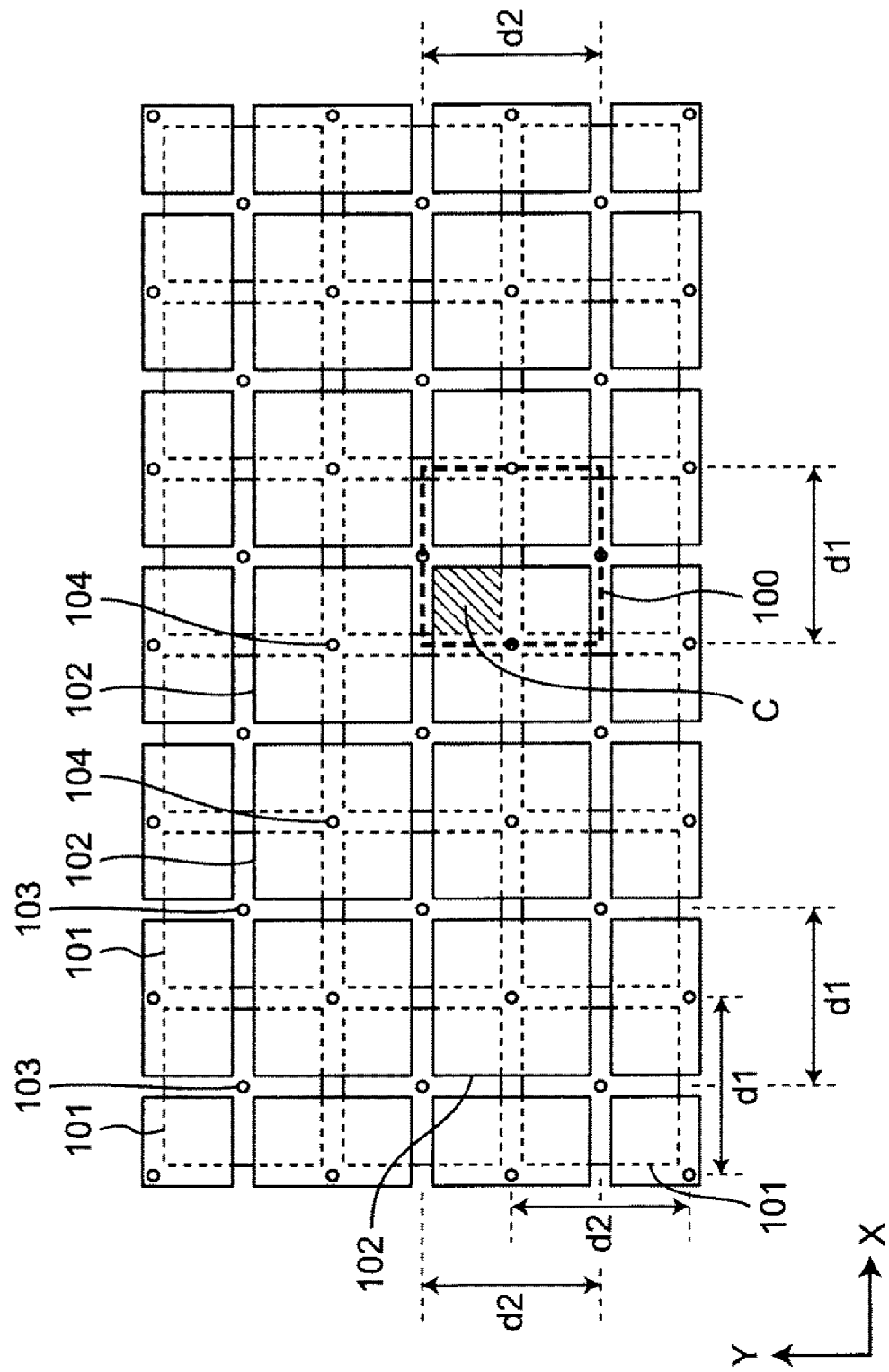
FIG. 18 is a top view showing a capacitor device according to a third embodiment in a state where no external terminal is formed.

FIG. 18 is a top view showing the capacitor device according to the third embodiment, in which no external terminal is formed. The capacitor device of FIG. 18 includes a plurality of capacitor cells C formed on a rectangular semiconductor substrate having sides extending along a first direction and a second direction orthogonal to each other.

FIG. 18 includes a plurality of lower electrodes 101, a plurality of upper electrodes 102, a plurality of cell terminals 103, and a plurality of cell terminals 104 formed on a semiconductor substrate. Each lower electrode 101, each upper electrode 102, each cell terminal 103, and each cell terminal 104 are the lower electrode, the upper electrode, the first cell terminal, and the second electrode of the capacitor device according to the first embodiment. It corresponds to each cell terminal. Each lower electrode 101, each upper electrode 102, each cell terminal 103, and each cell terminal 104 are formed on a semiconductor substrate including an oxide film, as in the capacitor device according to the first embodiment. After FIG. 18, the semiconductor substrate is omitted for simplification of illustration.

In this specification, the X direction in FIG. 18 or the like is also referred to as a first direction, and the Y direction is also referred to as a second direction. Further, in this specification, each lower electrode 101, each upper electrode 102, each cell terminal 103, and each cell terminal 104 is referred to as a first electrode, a second electrode, a first cell terminal, and a second cell terminal. Also called a cell terminal.

The plurality of lower electrodes 101 includes a portion (for example, a portion corresponding to the metal film 2 in FIG. 2) formed in the first layer of the semiconductor substrate, and is disposed at the first period d1 in the X direction. Arranged in the direction with a second period d2. The plurality of upper electrodes 102 include a portion (for example, a portion corresponding to the metal film 9 in FIG. 2) formed in a second layer different from the first layer of the semiconductor substrate, and is arranged with a period d1 in the X direction, and arranged with a period d2 in the Y direction. Each upper electrode 102 is arranged so as to be shifted from the lower electrode 101 by a half of the length of the period d1 in the X direction, and is shifted by a half of the length of the period d2 in the Y direction.

Each lower electrode 101 and each upper electrode 102 are partly opposed and capacitively coupled to each other, and each pair of lower electrode 101 and upper electrode 102 that are capacitively coupled to each other form a capacitor cell C.

The plurality of cell terminals 103 includes a portion formed in a third layer different from the first and second layers of the semiconductor substrate, and is arranged with a period d1 in the X direction and with a period d2 in the Y direction. The plurality of lower electrodes 101 are electrically connected to each other. At this time, the second layer is located between the first and third layers. The plurality of cell terminals 104 include a portion formed in the third layer of the semiconductor substrate, and are arranged with a period d1 in the X direction and with a period d2 in the Y direction, and are electrically connected to the plurality of upper electrodes 102, respectively. Each cell terminal 104 is arranged so as to be shifted from the cell terminal 103 by half the length of the period d1 in the X direction, and is shifted by half the length of the period d2 in the Y direction.

In other words, the capacitor device includes two lower electrodes 101 adjacent to each other in the Y direction and two upper electrodes 102 adjacent to each other in the X direction (or two lower electrodes 101 adjacent to each other in the X direction; A plurality of unit cells 100 (including two upper electrodes 102 adjacent to each other in the Y direction) are included. Each unit cell 100 includes four capacitor cells C formed from a pair of lower electrode 101 and upper electrode 102 that are capacitively coupled to face each other. Capacitor cells C having a desired number of rows and columns are formed by repeatedly arranging a plurality of unit cells 100.

The capacitor device according to the third embodiment may be configured similarly to the capacitor device according to the first embodiment. In this case, the semiconductor substrate has a first surface and a second surface. The capacitor device includes a first silicon oxide film exposed on the first surface and a passivation film exposed on the second surface. Each lower electrode 101 is formed on the first silicon oxide film and includes a plurality of stacked conductor films. Each upper electrode 102 includes a plurality of stacked conductor films. The capacitor device further includes an insulating film formed between each lower electrode 101 and each upper electrode 102 and a second silicon oxide film formed on each upper electrode 102. The passivation film is formed on the second silicon oxide film. Cell terminals 103 and 104 are exposed on the second surface. Each capacitor cell C is formed of a pair of lower electrode 101 and upper electrode 102 that are capacitively coupled to face each other, and an insulating film formed therebetween.

Each capacitor cell C may be formed as a crown type stack capacitor.

Each of the cell terminals 103 and 104 may be configured similarly to the first and second cell terminals of the capacitor device according to the first embodiment. In this case, each cell terminal 103 is electrically connected to the first pad conductor formed on the third layer of the semiconductor substrate and one of the plurality of lower electrodes 101 from the first pad conductor. Similarly, each cell terminal 104 is electrically connected to a second pad conductor formed on the third layer of the semiconductor substrate and one of the plurality of upper electrodes 102 from the second pad conductor.

Figure 19:
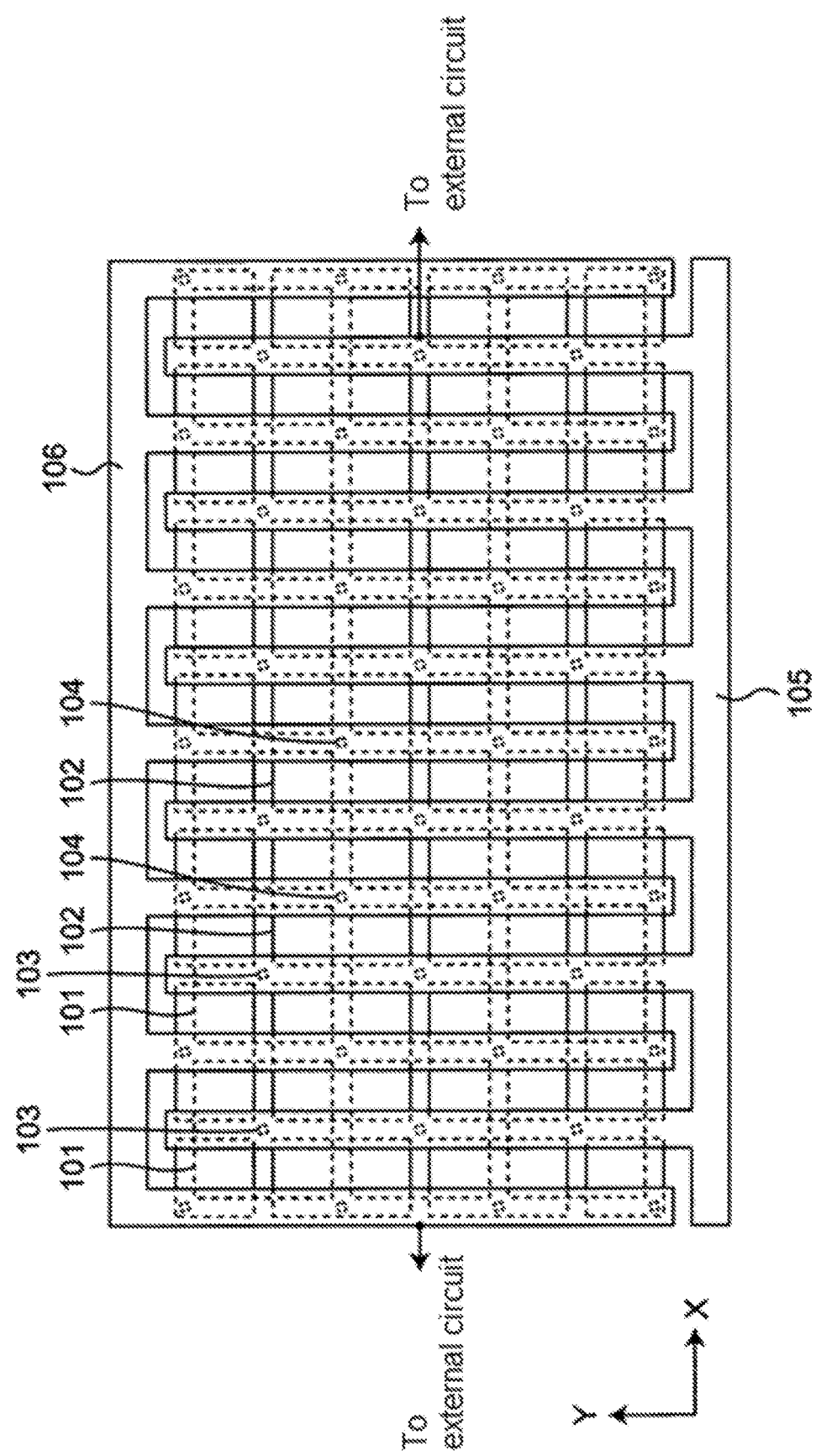
FIG. 19 is a top view showing a capacitor device according to a third embodiment in which external terminals 105 and 106 are formed in the capacitor device of FIG. 18.

FIG. 19 is a top view showing the capacitor device according to the third embodiment, in which external terminals 105 and 106 are formed in the capacitor device of FIG. 18. The capacitor device further includes at least two external terminals 105 and 106 for electrical connection to a circuit external to the capacitor device. Each external terminal 105 and 106 is electrically connected to a part of the plurality of cell terminals including the plurality of cell terminals 103 and the plurality of cell terminals 104, respectively.

The plurality of cell terminals 103 and 104 extend in the Y direction, and form a plurality of cell terminal rows adjacent to each other in the extending direction.

In the example of FIG. 19, the capacitor device includes external terminals 105 and 106 each having a comb shape. The external terminal 105 includes a plurality of first portions (portions extending in the Y direction) electrically connected to every 2N cell terminal rows of the plurality of cell terminal rows when N is an integer, and a second portion (a portion extending in the X direction) that connects the first portions to each other. The external terminal 106 also includes a plurality of first portions (portions extending in the Y direction) electrically connected to every 2N cell terminal rows of the plurality of cell terminal rows, and a first portion, and a second portion (a portion extending in the X direction) connected to each other. Each first portion of the external terminal 105 and each first portion of the external terminal 106 are formed so as to be fitted to each other. Each of the external terminals 105 and 106 is arranged such that every N cell terminal rows of the plurality of cell terminal rows are electrically connected to the external terminals 105 and 106 alternately.

FIG. 19 shows a case where N=1. Accordingly, the external terminal 105 is electrically connected to every two cell terminal rows of the plurality of cell terminal rows, and the external terminal 106 is also connected to every two cell terminal rows of the plurality of cell terminal rows. Is electrically connected. Each of the external terminals 105 and 106 is arranged such that a plurality of cell terminal arrays are alternately electrically connected to the external terminals 105 and 106.

The external terminals 105 and 106 can be connected to a voltage source having an arbitrary voltage. For example, one of them may be connected to a power source and the other may be grounded.

The external terminals 105 and 106 are electrically connected to a circuit external to the capacitor device at a portion electrically connected to one of the plurality of cell terminal rows (that is, each first portion of the external terminals 105 and 106). Instead, the external terminals 105 and 106 may be electrically connected to a circuit outside the capacitor device in their respective second portions (portions extending in the X direction).

Figure 20:
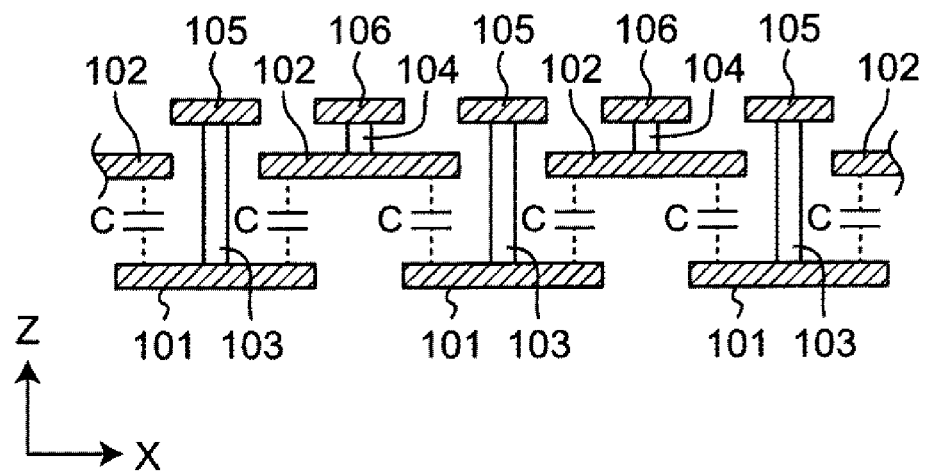
FIG. 20 is a circuit diagram showing an equivalent circuit of the capacitor device of FIG. 18.

FIG. 20 is a circuit diagram showing an equivalent circuit of the capacitor device of FIG. 18. As described above, each capacitor cell C is formed between each pair of the lower electrode 101 and the upper electrode 102 that are capacitively coupled to face each other. According to FIG. 20, one capacitor cell C is formed between the external terminals 105 and 106 adjacent to each other. Therefore, in the entire capacitor device, a plurality of capacitor cells C are connected in parallel.

Figure 21:
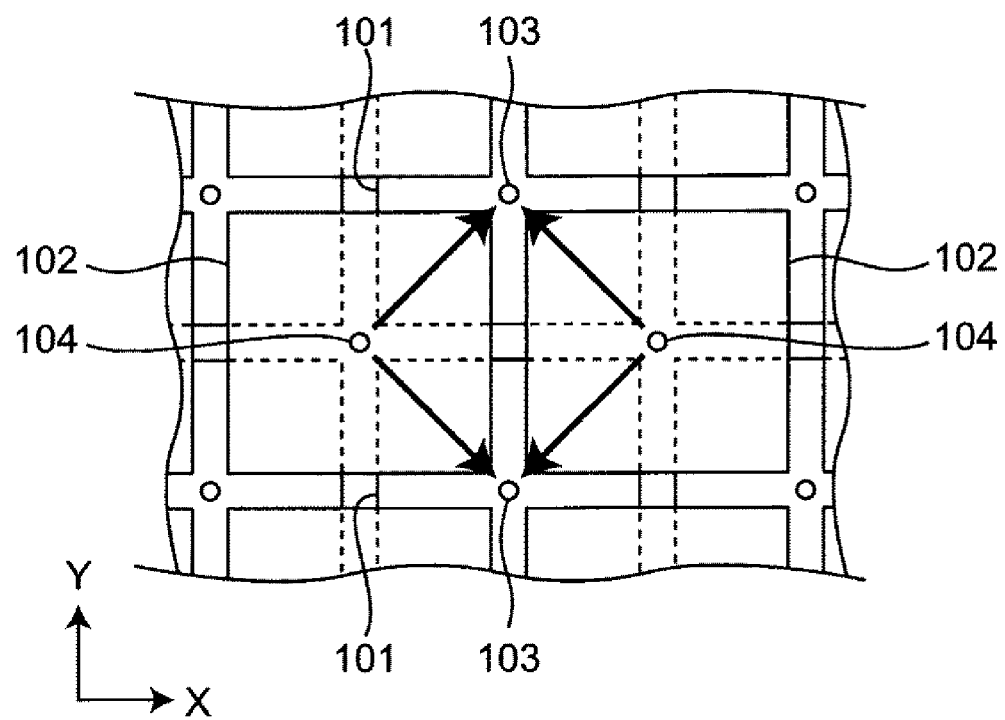
FIG. 21 is a schematic diagram showing a current flowing through the capacitor device of FIG. 18.

FIG. 21 is a schematic diagram showing a current flowing through the capacitor device of FIG. 18. In FIG. 21, the external terminals 105 and 106 are omitted. For example, when the external terminal 106 (and hence the cell terminal 104) is connected to the power supply and the external terminal 105 (and hence the cell terminal 103) is grounded, a current flows in the direction of the arrow. In order to reduce the equivalent series inductance (ESL), it is effective to lay out the components of the capacitor device so that the currents through the capacitor device cancel each other. As shown in FIG. 21, the equivalent series inductance can be reduced by arranging each lower electrode 101, each upper electrode 102, each cell terminal 103, and each cell terminal 104 periodically and symmetrically. As shown in FIG. 19, the equivalent series inductance is best reduced when a fine pitch bump is formed in a portion where the external terminals 105 and 106 are electrically connected to one of the plurality of cell terminal rows.

The period d1 in which each lower electrode 101, each upper electrode 102, each cell terminal 103, and each cell terminal 104 are arranged in the X direction and the period d2 in which each cell terminal 104 is arranged in the Y direction may be set to be equal to each other. FIG. 18 shows a case where d1=d2, for example.

Figure 22:
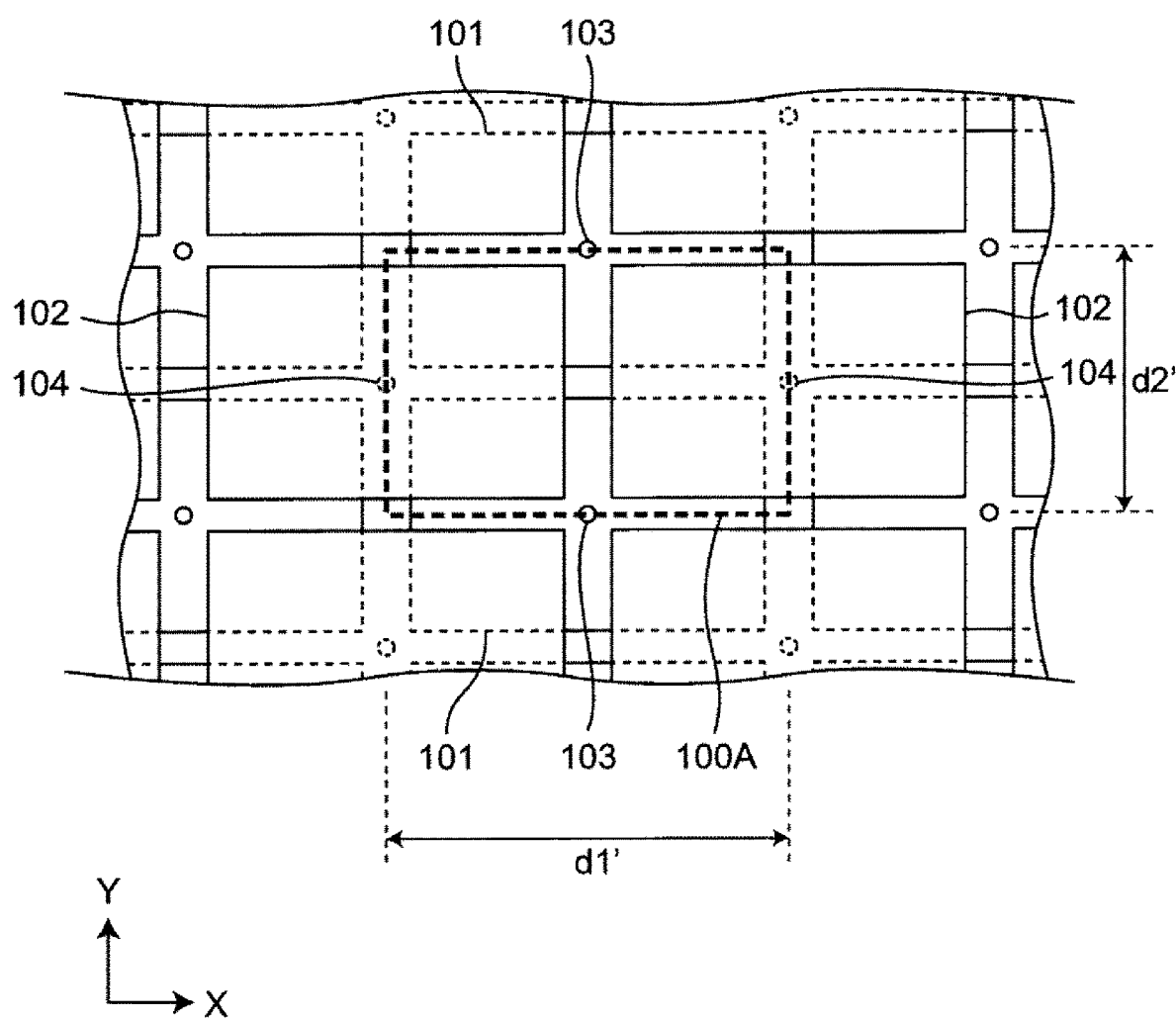
FIG. 22 is a top view showing a part of a capacitor device according to a modification of the third embodiment and showing a state in which no external terminal is formed.

FIG. 22 is a top view showing a part of a capacitor device according to a modification of the third embodiment and showing a state in which no external terminal is formed. In the example of FIG. 22, the period d1' in which the upper electrodes 102, the cell terminals 103, and the cell terminals 104 are arranged in the X direction and the period d2' in the Y direction are set to be different from each other. The unit cell 100A includes two lower electrodes 101 adjacent in the Y direction and two upper electrodes 102 adjacent in the X direction. The capacitor device of FIG. 22 can also operate in the same manner as the capacitor device of FIG. 18.

According to the capacitor device according to the third embodiment, a capacitor device having characteristics such as a different capacitance, a different capacitance density, a different breakdown voltage, and/or a different position and number of terminals from the capacitor device of FIG. 19. In this case, only a mask for forming the external terminals 105 and 106 may be replaced as described in the following embodiments. In order to form a plurality of capacitor cells C, a plurality of expensive masks are required. According to the capacitor device according to the third embodiment, when customizing the capacitor device according to customer requirements, by changing only one (or a small number) of relatively inexpensive masks, the external terminals 105 and 106 can be changed. The shape can be changed, whereby the characteristics of the capacitor described above can be changed. At this time, it is not necessary to change the mask for forming the plurality of capacitor cells C. As described above, according to the capacitor device according to the third embodiment, it is possible to manufacture the capacitor device by changing the characteristics of the capacitor described above at a lower cost than before.

Fourth Embodiment

Figure 23:
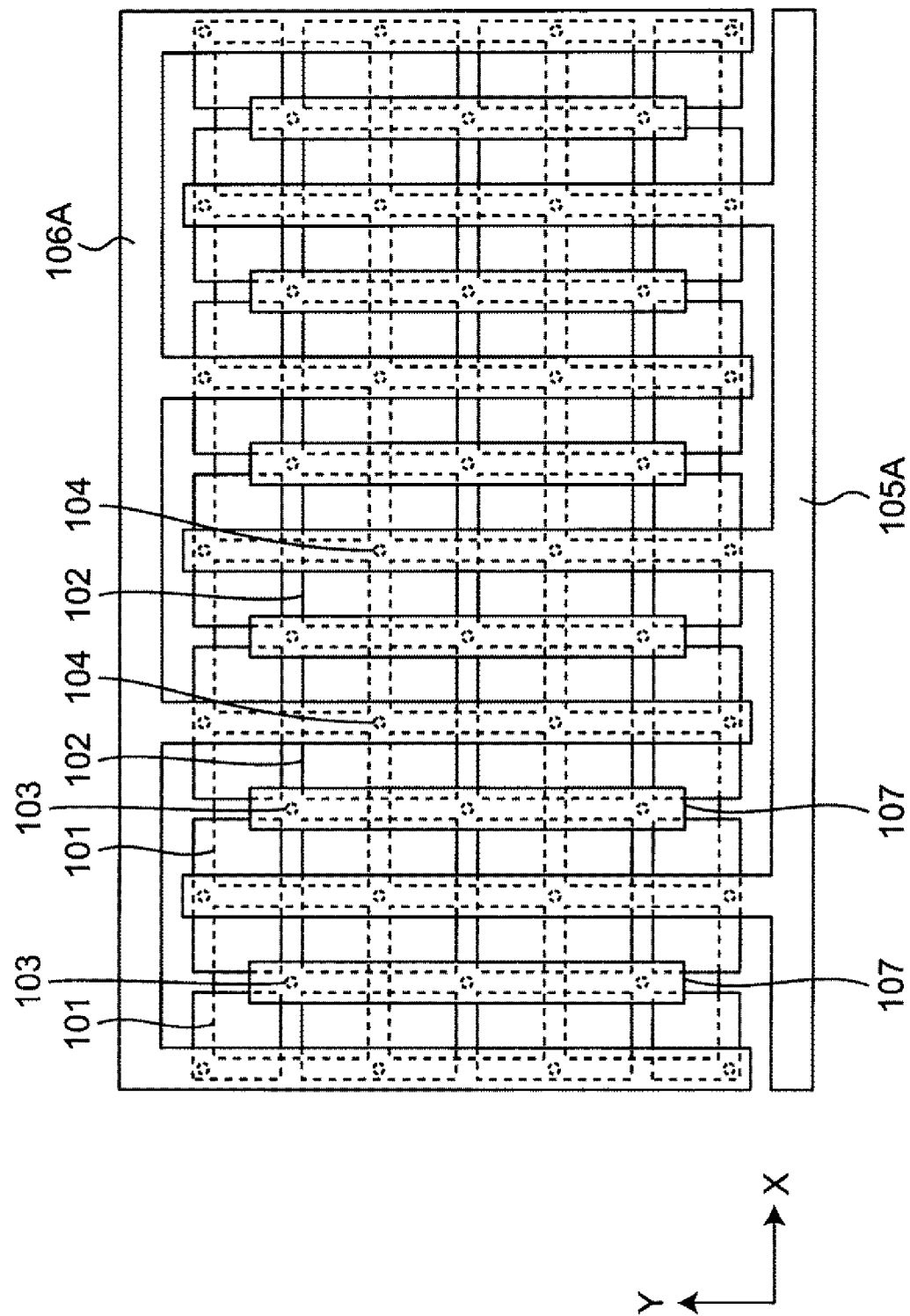
FIG. 23 is a top view showing a configuration of a capacitor device according to a fourth embodiment.

FIG. 23 is a top view showing the configuration of the capacitor device according to the fourth embodiment. The capacitor device of FIG. 23 includes external terminals 105A and 106A each having a comb shape. FIG. 23 shows a case where N=2. Accordingly, the external terminals 105A extend in the Y direction and are electrically connected to every four cell terminal rows of the plurality of adjacent cell terminal rows, and the external terminal 106A is also a plurality of cell terminals. It is electrically connected to every four cell terminal rows in the row. Each of the external terminals 105A and 106A is arranged such that every two cell terminal rows of the plurality of cell terminal rows are electrically connected to the external terminals 105A and 106A alternately.

The capacitor device of FIG. 23 further includes a plurality of floating terminals 107 that are electrically connected to the cell terminal row including the cell terminals 103 that are not connected to the external terminals 105A and 106A, due to the convenience of the semiconductor process technology. Each floating terminal 107 is not connected to other circuits.

Figure 24:
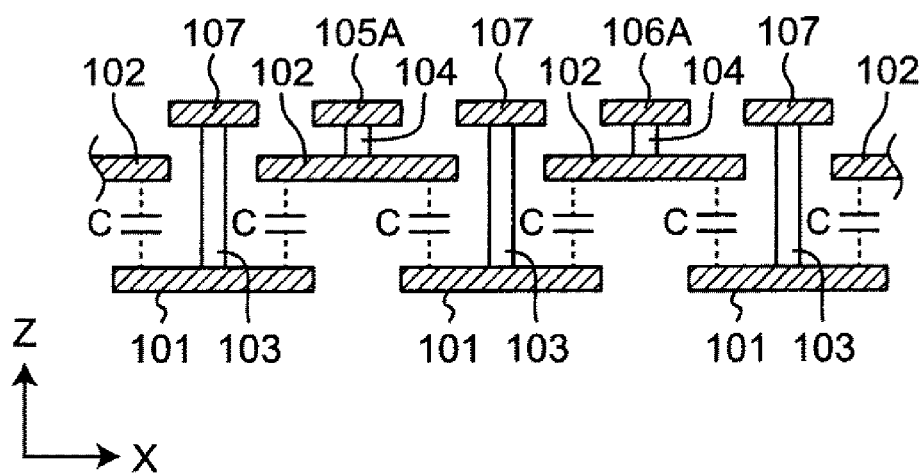
FIG. 24 is a circuit diagram showing an equivalent circuit of the capacitor device of FIG. 23.

FIG. 24 is a circuit diagram showing an equivalent circuit of the capacitor device of FIG. 23. According to FIG. 24, two capacitor cells C are formed between the external terminals 105A and 106A adjacent to each other. Therefore,

Fifth Embodiment

Figure 25:
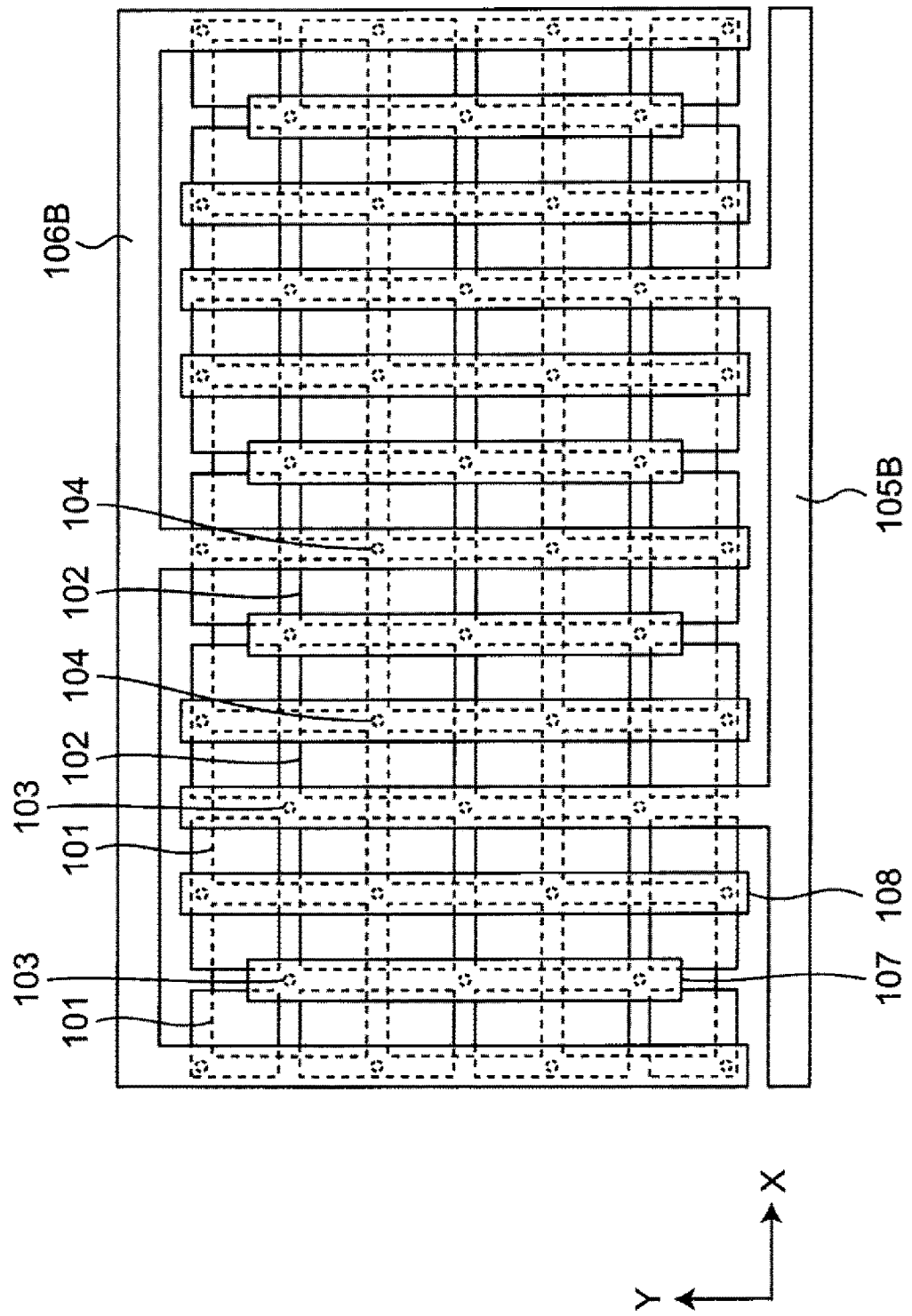
FIG. 25 is a top view showing a configuration of a capacitor device according to a fifth embodiment.

FIG. 25 is a top view showing the configuration of the capacitor device according to the fifth embodiment. The capacitor device of FIG. 25 includes external terminals 105B and 106B each having a comb shape. FIG. 25 shows a case where N=3. Accordingly, the external terminals 105B extend in the Y direction and are electrically connected to every six cell terminal rows among the plurality of adjacent cell terminal rows, and the external terminal 106B also has a plurality of cell terminals. It is electrically connected to every six cell terminal rows in the row. Each of the external terminals 105B and 106B is arranged such that every three cell terminal rows of the plurality of cell terminal rows are electrically connected to the external terminals 105B and 106B alternately.

The capacitor device of FIG. 25 further includes a plurality of floating terminals 107 and 108 that are electrically connected to cell terminal rows that are not connected to the external terminals 105B and 106B, respectively, for the convenience of semiconductor process technology. Each floating terminal 107 is electrically connected to a cell terminal row including cell terminals 103, and each floating terminal 108 is electrically connected to a cell terminal row including cell terminals 104. Each floating terminal 107 and 108 is not connected to other circuits.

Figure 26:
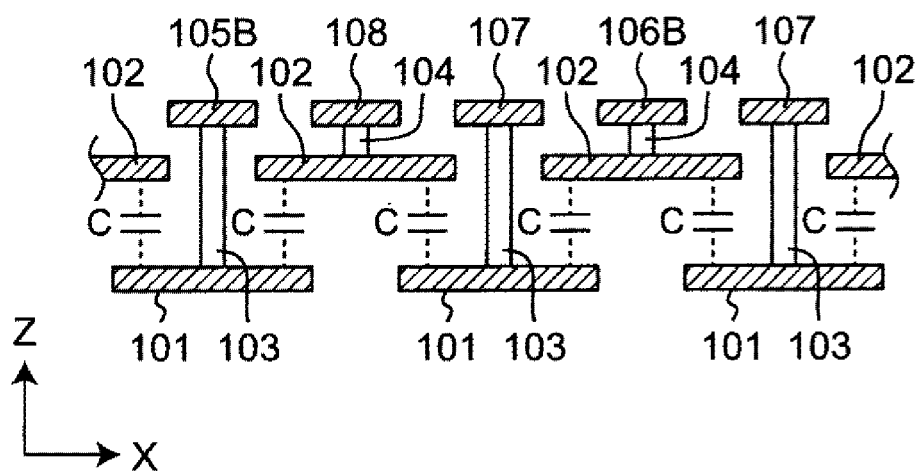
FIG. 26 is a circuit diagram showing an equivalent circuit of the capacitor device of FIG. 25.

FIG. 26 is a circuit diagram showing an equivalent circuit of the capacitor device of FIG. 25. According to FIG. 26, three capacitor cells C are formed between the external terminals 105B and 106B adjacent to each other. Therefore, in the entire capacitor device, a plurality of circuits each including three capacitor cells C connected in series are connected in parallel.

Sixth Embodiment

Figure 27:
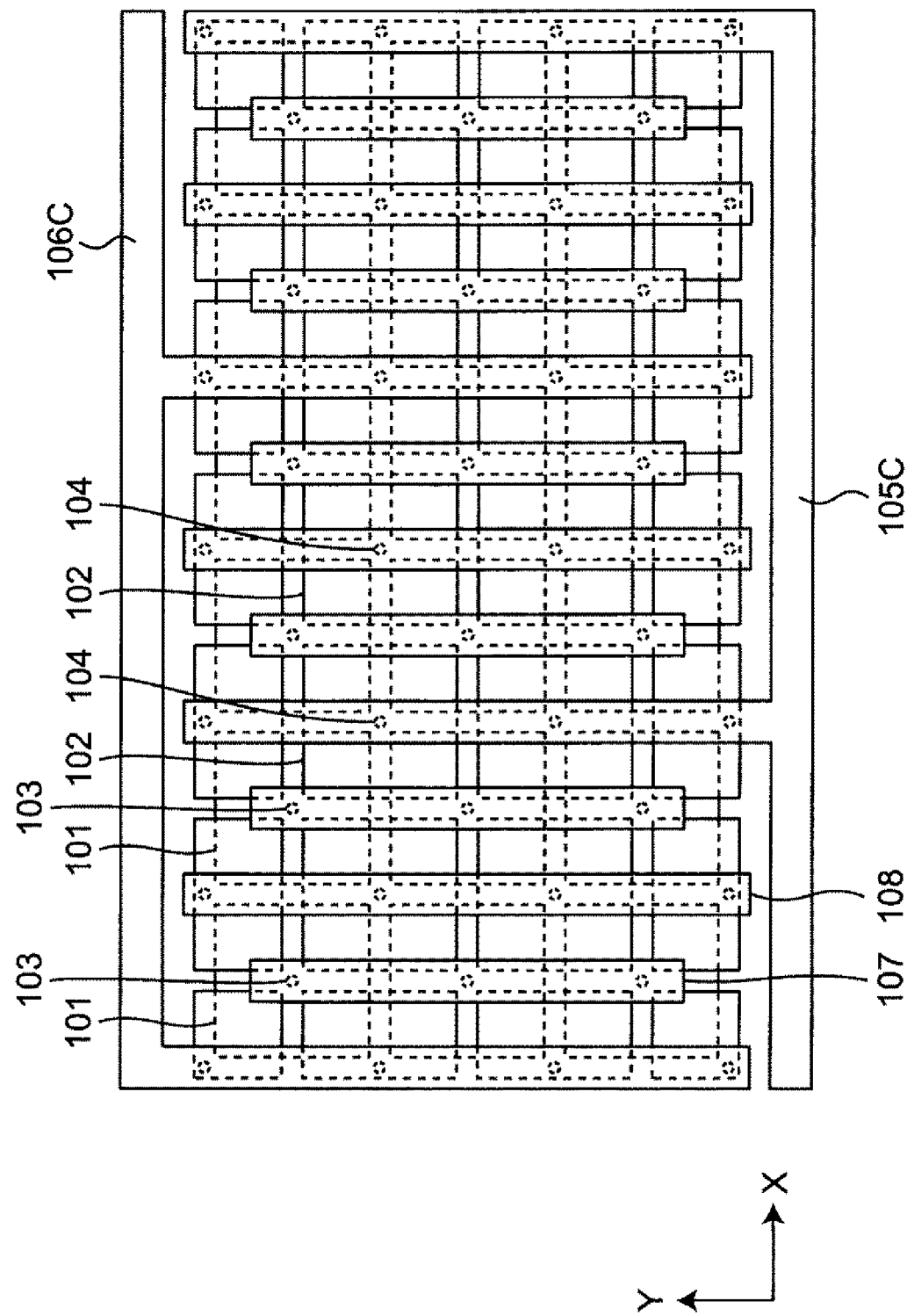
FIG. 27 is a top view showing a configuration of a capacitor device according to a sixth embodiment.

FIG. 27 is a top view showing the configuration of the capacitor device according to the sixth embodiment. The capacitor device of FIG. 27 includes external terminals 105C and 106C each having a comb shape. FIG. 27 shows a case where N=4. Therefore, the external terminal 105C extends in the Y direction and is electrically connected to every eight cell terminal rows of the plurality of adjacent cell terminal rows, and the external terminal 106C is also a plurality of cell terminals. It is electrically connected to every eight cell terminal rows in the row. Each of the external terminals 105C and 106C is arranged such that every four cell terminal rows of the plurality of cell terminal rows are electrically connected to the external terminals 105C and 106C alternately.

The capacitor device of FIG. 27 further includes a plurality of floating terminals 107 and 108 that are electrically connected to cell terminal rows that are not connected to the external terminals 105C and 106C, respectively, due to the convenience of semiconductor process technology. Each floating terminal 107 is electrically connected to a cell terminal row including cell terminals 103, and each floating terminal 108 is electrically connected to a cell terminal row including cell terminals 104. Each floating terminal 107 and 108 is not connected to other circuits.

Figure 28:
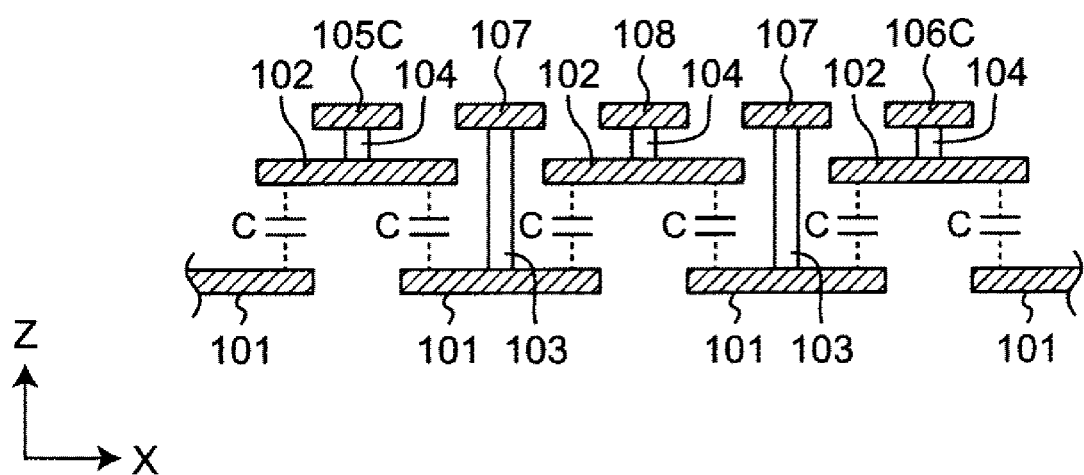
FIG. 28 is a circuit diagram showing an equivalent circuit of the capacitor device of FIG. 27.

FIG. 28 is a circuit diagram showing an equivalent circuit of the capacitor device of FIG. 27. According to FIG. 28, four capacitor cells C are formed between the external terminals 105C and 106C adjacent to each other. Therefore, in the entire capacitor device, a plurality of circuits each including four capacitor cells C connected in series are connected in parallel.

Similarly to the capacitor devices according to the third to sixth embodiments, when N is an integer equal to or greater than 5, a pair of external terminals includes a pair of cell terminal rows every N of the plurality of cell terminal rows. You may arrange | position so that it may be electrically connected to an external terminal alternately.

According to the capacitor devices according to the third to sixth embodiments, the number of capacitor cells C connected in series can be changed by changing the shape of the external terminal. The number of capacitor cells C connected in series is inversely proportional to the capacity density and breakdown voltage of the capacitor device. By changing only the mask for the external terminals according to customer requirements, a capacitor device having an optimum capacity density and withstand voltage can be manufactured at low cost.

Seventh Embodiment

Figure 29:
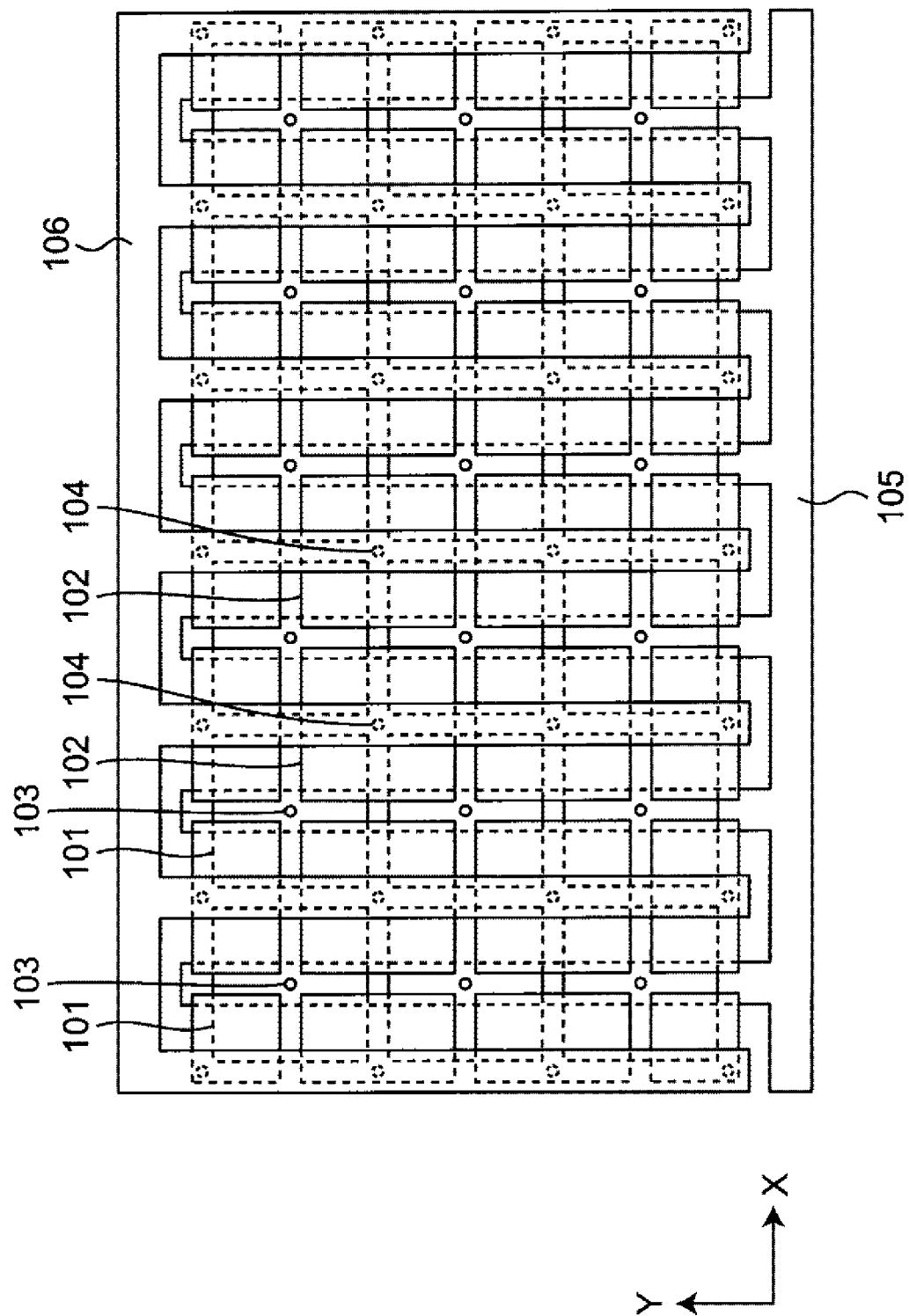
FIG. 29 is a top view showing a configuration of a capacitor device according to a seventh embodiment.

FIG. 29 is a top view showing the configuration of the capacitor device according to the seventh embodiment. The plurality of external terminals 105 and 106 are not limited to being formed in the same layer. In the capacitor device of FIG. 29, the external terminal 105 is formed below the lower electrode 101, and the external terminal 106 is formed above the upper electrode 102. The capacitor device according to the seventh embodiment can also operate in the same manner as the capacitor device according to the third embodiment.

Eighth Embodiment

Figure 30:
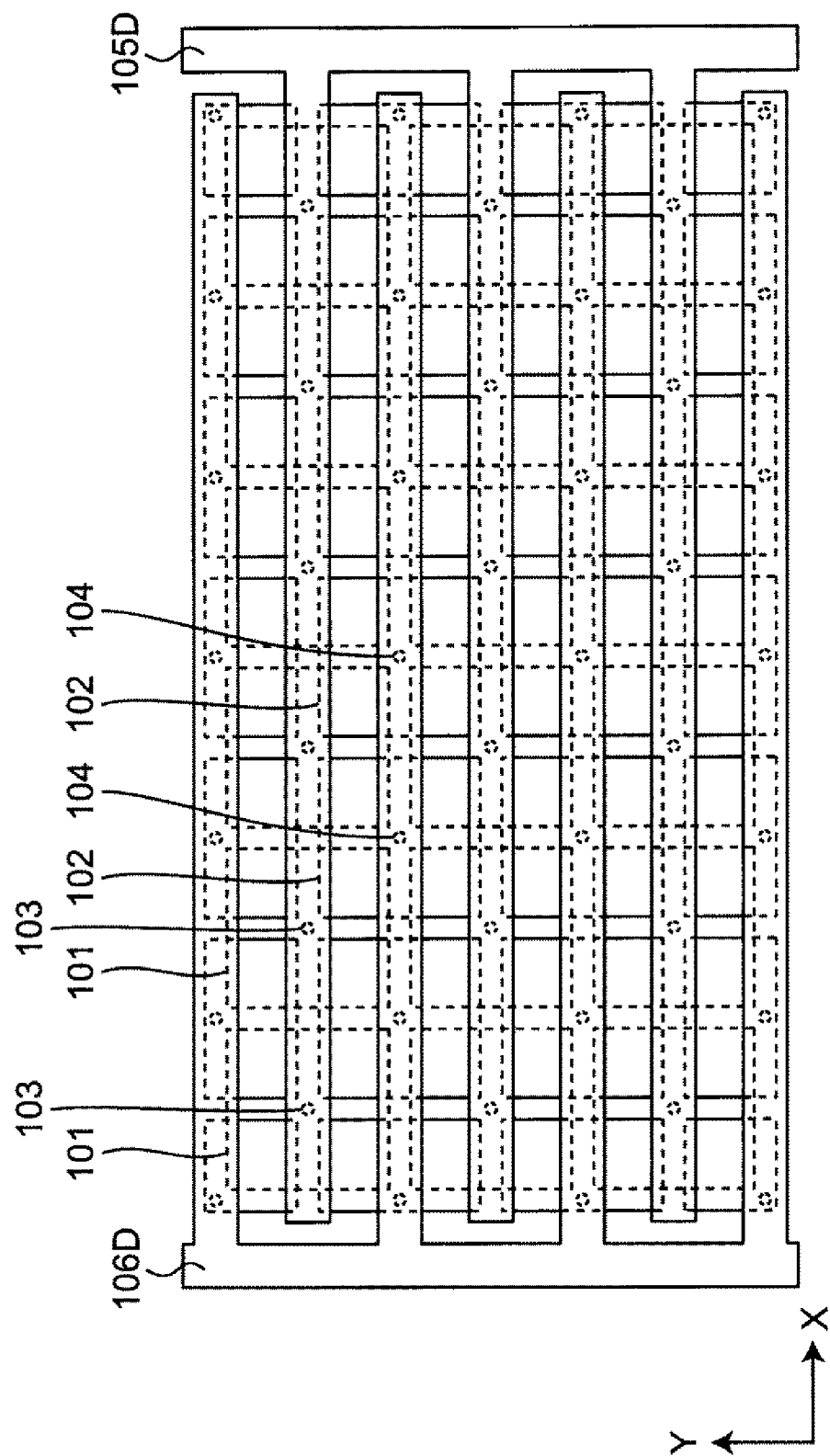
FIG. 30 is a top view showing a configuration of a capacitor device according to an eighth embodiment.

FIG. 30 is a top view showing the configuration of the capacitor device according to the eighth embodiment. The plurality of cell terminals 103 and 104 extend in the X direction and are adjacent to each other in the extending direction instead of the cell terminal rows extending in the Y direction as in the third to seventh embodiments. The cell terminal array may be formed.

In the example of FIG. 30, the capacitor device includes external terminals 105D and 106D each having a comb shape. The external terminal 105D has a plurality of first portions (portions extending in the X direction) electrically connected to every 2N cell terminal rows of the plurality of cell terminal rows when N is an integer, and a second portion (a portion extending in the Y direction) that connects the first portions to each other. The external terminal 106D also includes a plurality of first portions (portions extending in the X direction) electrically connected to every 2N cell terminal rows of the plurality of cell terminal rows, and a first portion, and a second portion (a portion extending in the Y direction) connected to each other. Each first portion of the external terminal 105D and each first portion of the external terminal 106D are formed so as to be fitted to each other. Each of the external terminals 105D and 106D is arranged such that every N cell terminal rows of the plurality of cell terminal rows are electrically connected to the external terminals 105D and 106D alternately.

FIG. 30 shows a case where N=1. Accordingly, the external terminal 105D is electrically connected to every two cell terminal rows of the plurality of cell terminal rows, and the external terminal 106D is also connected to every two cell terminal rows of the plurality of cell terminal rows.

Is electrically connected. Each of the external terminals 105D and 106D is arranged such that a plurality of cell terminal arrays are alternately electrically connected to the external terminals 105D and 106D.

The external terminals 105D and 106D are electrically connected to a circuit outside the capacitor device in a portion electrically connected to one of the plurality of cell terminal rows (that is, each first portion of the external terminals 105D and 106D). May be connected. Instead, the external terminals 105D and 106D may be electrically connected to a circuit outside the capacitor device in their respective second portions (portions extending in the Y direction).

Similarly to the capacitor devices according to the fourth to sixth embodiments, when N is an integer equal to or larger than 2, a pair of external terminals includes a pair of cell terminal rows every N of the plurality of cell terminal rows. You may arrange l position so that it may be electrically connected to an external terminal alternately.

The capacitor device according to the eighth embodiment has an effect that the shape of the external terminal and the position at which the external terminal is electrically connected to a circuit outside the capacitor device can be customized according to customer requirements. The capacitor device may include external terminals 105D and 106D formed as in the eighth embodiment, and these external terminals 105D and 106D are short sides (sides extending in the Y direction) of the rectangular capacitor device, may be electrically connected to a circuit outside the capacitor device. Instead, the capacitor device may include external terminals 105 and 106 formed as in the third to seventh embodiments, and these external terminals 105 and 106 are the length of the rectangular capacitor device. The side (side extending in the X direction) may be electrically connected to a circuit outside the capacitor device.

The equivalent series inductance is higher in the third to seventh embodiments than in the case where the short side of the rectangular capacitor device is electrically connected to a circuit outside the capacitor device as in the eighth embodiment. Thus, the case where the long side of the rectangular capacitor device is electrically connected to a circuit outside the capacitor device is reduced.

Ninth Embodiment

Figure 31:
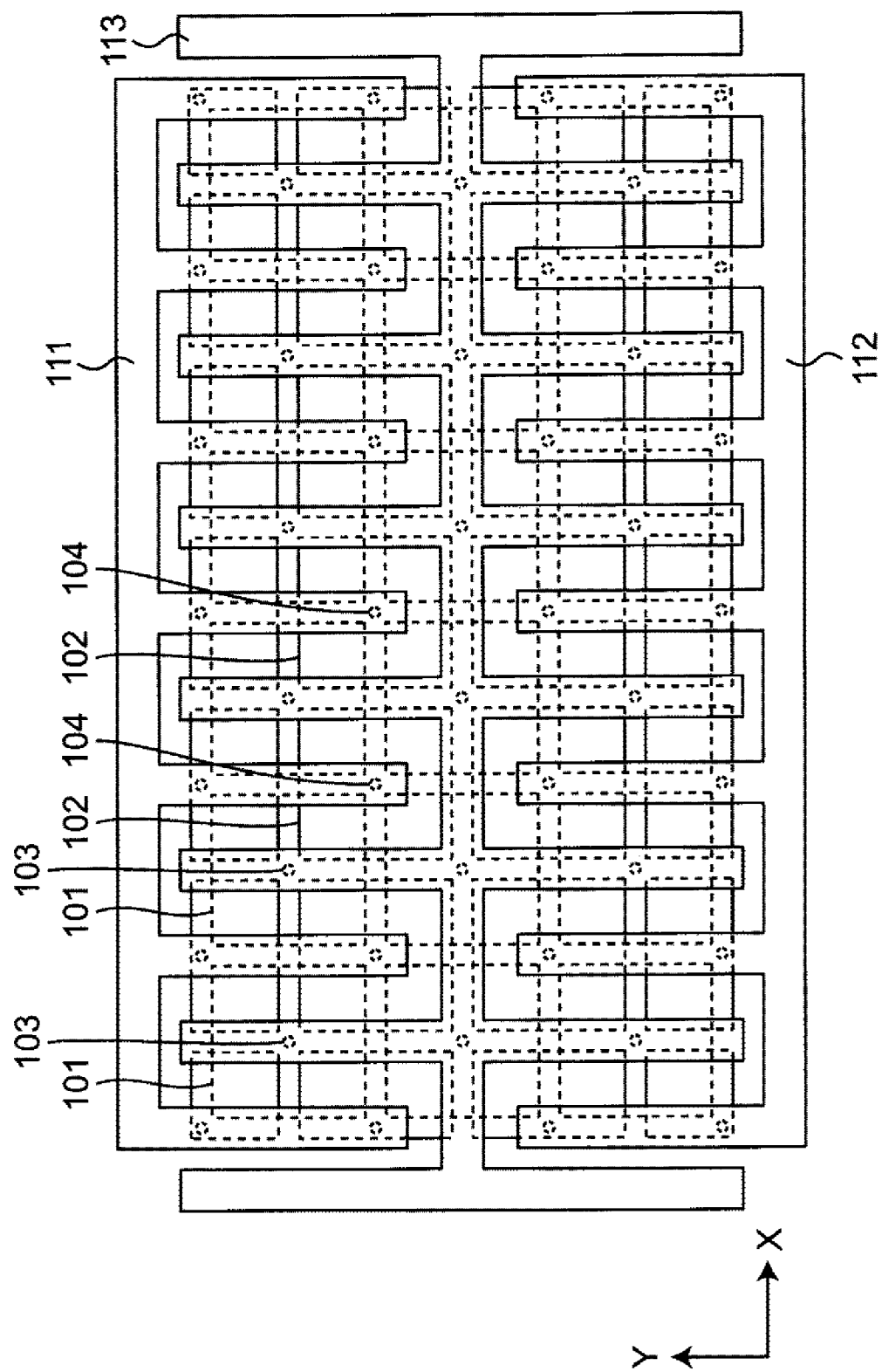
FIG. 31 is a top view showing a configuration of a capacitor device according to a ninth embodiment.

FIG. 31 is a top view showing the configuration of the capacitor device according to the ninth embodiment.

The plurality of cell terminals 103 and 104 extend in the Y direction, and form a plurality of cell terminal rows adjacent to each other in the extending direction.

The capacitor device includes external terminals 111 and 112 each having a comb shape, and an external terminal 113 having a fishbone shape. The external terminal 113 includes a plurality of first portions (portions extending in the Y direction) electrically connected to every 2N cell terminal rows of the plurality of cell terminal rows when N is an integer, and a second portion (a portion extending in the X direction) for connecting the first portions of the external terminals 113 to each other at the center of the first portions of the external terminals 113. The external terminal 111 includes a plurality of first portions (extending in the Y direction) that are electrically connected to a part of the plurality of cell terminals included in every 2N cell terminal rows of the plurality of cell terminal rows, and a second portion (a portion extending in the X direction) that connects the first portions of the external terminals 111 to each other. The external terminal 111 is formed on the first side with respect to the second portion of the external terminal 113 so as to be fitted to the first portion of the external terminal 113. The external terminal 112 includes a plurality of first portions (extending in the Y direction) that are electrically connected to a part of the plurality of cell terminals included in every 2N cell terminal rows of the plurality of cell terminal rows, and a second portion (a portion extending in the X direction) that connects the first portions of the external terminals 112 to each other. The external terminal 112 is formed to be fitted to the first portion of the external terminal 113 on the second side opposite to the first side with respect to the second portion of the external terminal 113. Each of the external terminals 111 to 113 is arranged such that every N cell terminal rows of the plurality of cell terminal rows are electrically connected to the external terminals 111 and 112 and the external terminal 113 alternately.

FIG. 31 shows a case where N=1. Accordingly, the external terminal 113 is electrically connected to every two cell terminal rows of the plurality of cell terminal rows. The external terminal 111 is electrically connected to a part of the plurality of cell terminals included in every two cell terminal rows of the plurality of cell terminal rows. Each of the external terminals 112 to 113 electrically connected to a part of the plurality of cell terminals included in every two cell terminal columns of the plurality of cell terminal columns which are arranged so as to be electrically connected to the external terminals 111 and 112 and the external terminal 113 alternately.

The external terminals 111 and 112 may be electrically connected to a circuit outside the capacitor device on the long side (side extending in the X direction) of the capacitor device. The external terminal 113 may be electrically connected to a circuit outside the capacitor device on the short side (side extending in the Y direction) of the capacitor device.

The external terminal 113 is connected to a power source, for example, and the external terminals 111 and 112 are grounded, for example.

The capacitor device according to the ninth embodiment has an effect of reducing the equivalent series inductance compared to the third to eighth embodiments by changing the shape of the external terminal.

Tenth Embodiment

Figure 32:
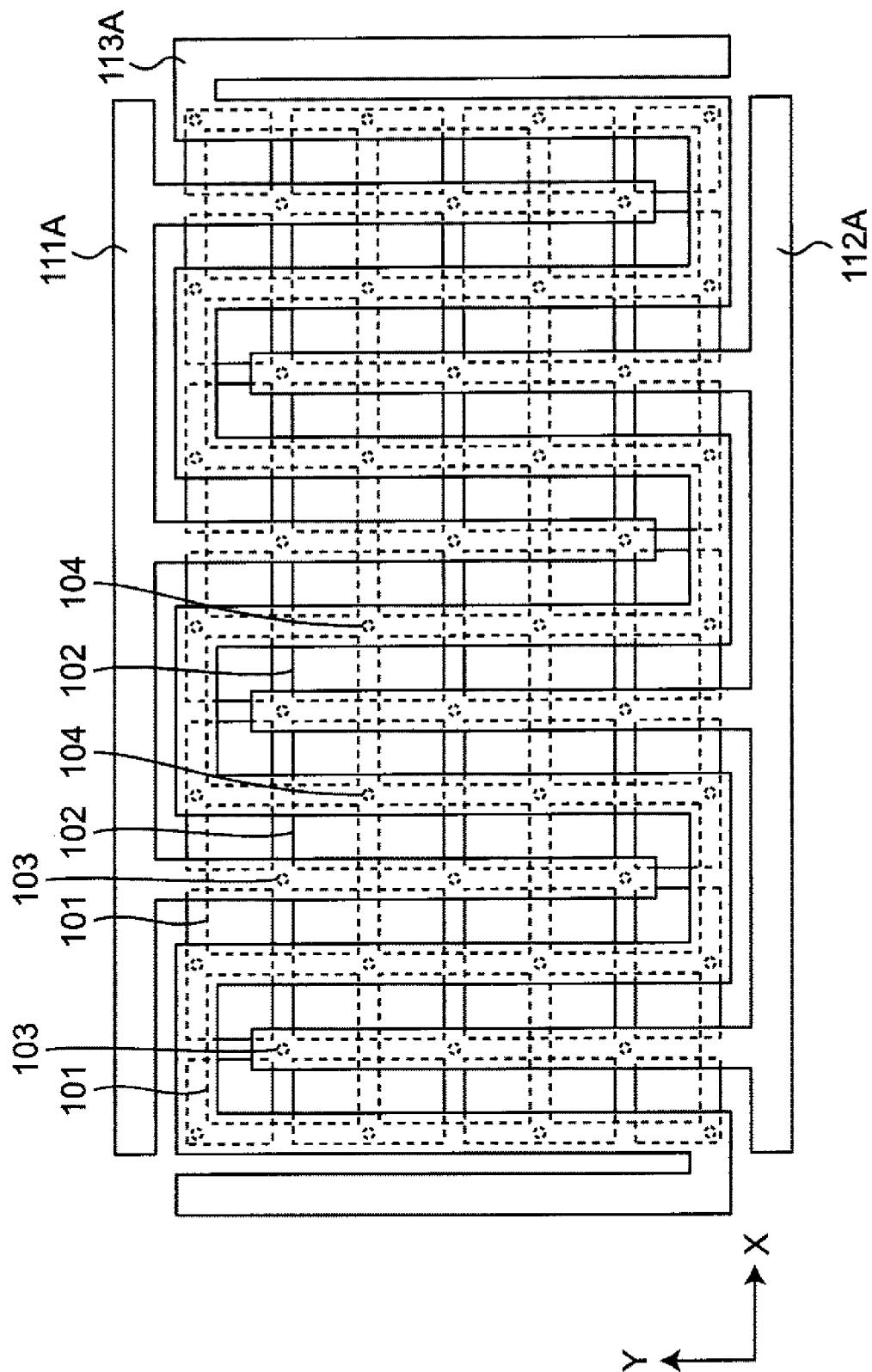
FIG. 32 is a top view showing a configuration of a capacitor device according to a tenth embodiment.

FIG. 32 is a top view showing the configuration of the capacitor device according to the tenth embodiment.

The plurality of cell terminals 103 and 104 extend in the Y direction, and form a plurality of cell terminal rows adjacent to each other in the extending direction.

The capacitor device includes external terminals 111A and 112A each having a comb shape, and an external terminal 113A having a meander shape. The external terminal 113A has a plurality of first portions (portions extending in the Y direction) electrically connected to every 2N cell terminal rows of the plurality of cell terminal rows when N is an integer. A plurality of second portions (portions extending in the X direction) that connect the first portions of the external terminals 113A to each other at either of the longitudinal ends of the first portions of the external terminals 113A. The external terminal 111A includes a plurality of first portions (portions extending in the Y direction) electrically connected to every 4N cell terminal rows of the plurality of cell terminal rows, and each of the external terminals 111A. And a second portion (a portion extending in the X direction) that connects the first portions to each other. The external terminal 111A is formed on the first side with respect to the external terminal 113A so as to be fitted to the first portion of the external terminal 113A. The external terminal 112A includes a plurality of first portions (portions extending in the Y direction) electrically connected to every 4N cell terminal rows of the plurality of cell terminal rows, and each of the external terminals 112A, and a second portion (a portion extending in the X direction) that connects the first portions to each other. The external terminal 112A is formed to be fitted to the first portion of the external terminal 113A on the second side opposite to the first side with respect to the external terminal 113A. Each of the external terminals 111A to 113A is arranged such that every N cell terminal rows of the plurality of cell terminal rows are electrically connected to the external terminals 111A or 112A and the external terminals 113A alternately.

FIG. 32 shows a case where N=1. Accordingly, the external terminal 113A is electrically connected to every two cell terminal rows of the plurality of cell terminal rows. The external terminal 111A is electrically connected to every four cell terminal rows of the plurality of cell terminal rows. The external terminal 112A is electrically connected to every four cell terminal rows of the plurality of cell terminal rows. Each of the external terminals 111A to 113A is arranged such that a plurality of cell terminal arrays are alternately electrically connected to the external terminals 111A or 112A and the external terminals 113A.

The external terminals 111 A and 112 A may be electrically connected to a circuit outside the capacitor device on the long side (side extending in the X direction) of the capacitor device. The external terminal 113A may be electrically connected to a circuit outside the capacitor device on the short side (side extending in the Y direction) of the capacitor device.

The external terminal 113A is connected to a power source, for example, and the external terminals 111A and 112A are grounded, for example.

According to the capacitor device of the tenth embodiment, by changing the shape of the external terminal, it is equivalent to the third to eighth embodiments as in the case of the ninth embodiment. There is an effect of reducing the series inductance.

Eleventh Embodiment

Figure 33:
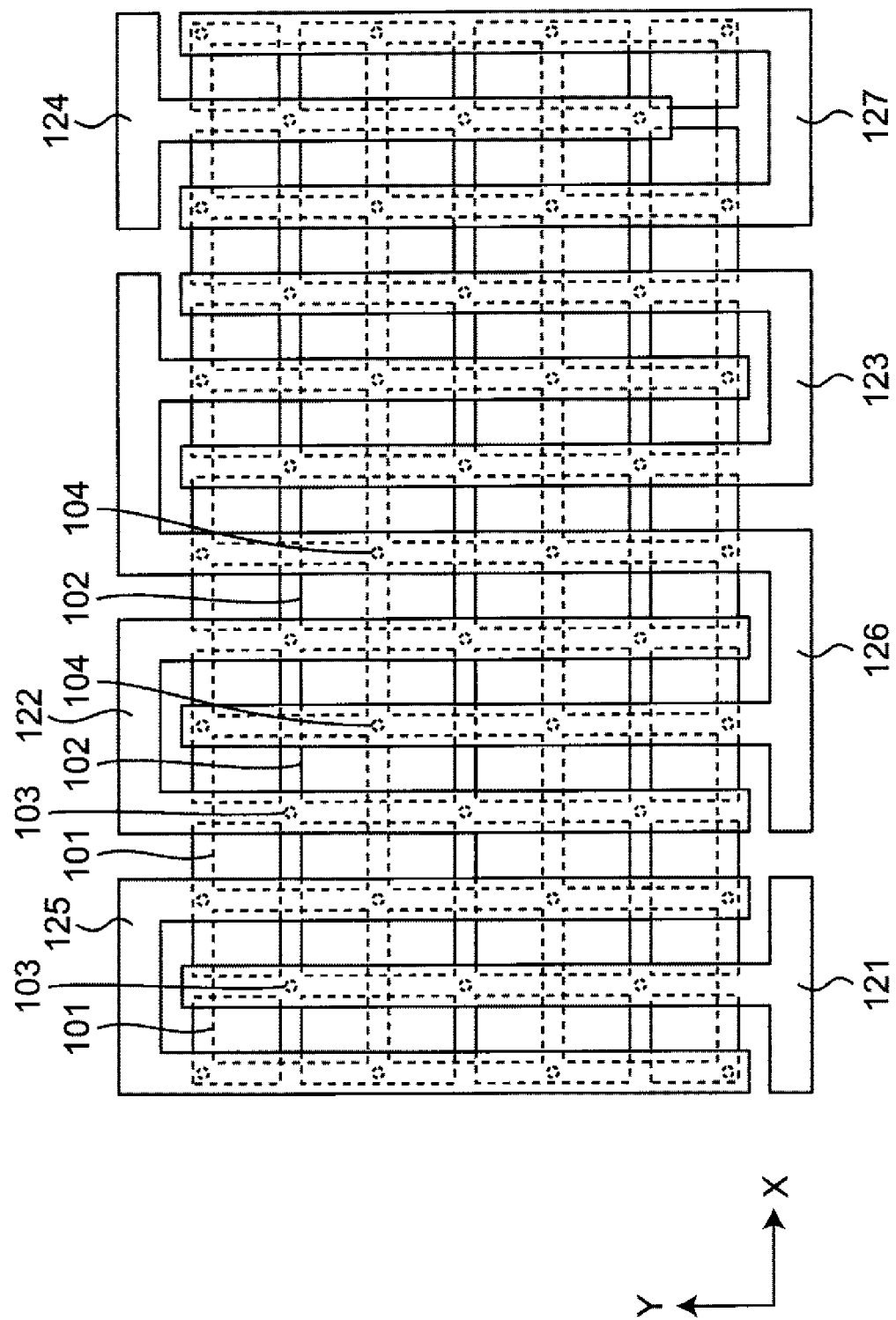
FIG. 33 is a top view showing a configuration of a capacitor device according to an eleventh embodiment.

FIG. 33 is a top view showing the configuration of the capacitor device according to the eleventh embodiment. The capacitor device may include four or more external terminals.

The plurality of cell terminals 103 and 104 extend in the Y direction, and form a plurality of cell terminal rows adjacent to each other in the extending direction.

The capacitor device includes a plurality of sets of external terminals each including first and second external terminals. In the example of FIG. 33, a set including the external terminals 121 and 125, a set including the external terminals 122 and 126, a set including the external terminals 123 and 126, and a set including the external terminals 124 and 127 are provided. Each of the first and second external terminals of each set includes a portion that is electrically connected to at least one cell terminal row of the plurality of cell terminal rows. Each of the first and second external terminals of each set is such that when N is an integer, every N cell terminal rows of the plurality of cell terminal rows are alternately connected to the first and second external terminals, arranged to be connected to each other.

FIG. 33 shows a case where N=1.

The external terminals 125 to 127 are connected to a power source, for example, and the external terminals 121 to 124 are grounded, for example. In this case, in each of the external terminals 121 to 127, a plurality of cell terminal arrays are alternately electrically connected to the external terminals 125 to 127 connected to the power source and the grounded external terminals 121 to 124. Further, among the long sides (sides extending in the X direction) of the capacitor device, the external terminals 125 and 126 connected to the power source and the external terminals 122 and 124 grounded are alternately provided on the +Y side. Similarly, of the long sides (sides extending in the X direction) of the capacitor device, the external terminals 126 and 127 connected to the power source and the external terminals 121 and 123 connected to the ground alternately on the −Y side side.

The capacitor device according to the eleventh embodiment has an effect of further reducing the equivalent series inductance compared to the ninth and tenth embodiments by changing the shape of the external terminal.

The capacitor devices according to the third to eleventh embodiments can be manufactured, for example, by the following manufacturing process.

The manufacturing method includes a plurality of lower electrodes 101 including a portion formed in a first layer of a semiconductor substrate, arranged at a period d1 in the X direction and arranged at a period d2 in the Y direction. A plurality of upper electrodes including a step of forming an electrode 101 and a portion formed in a second layer different from the first layer of the semiconductor substrate, the electrodes being arranged at a period d1 in the X direction, and in the Y direction; forming a plurality of upper electrodes 102 arranged at a period d2. The step of forming each upper electrode 102 is arranged so as to be shifted by half the length of the period d1 in the X direction with respect to each lower electrode 101 and shifted by half the length of the period d2 in the Y direction.

Each lower electrode 101 and each upper electrode 102 are partly opposed and capacitively coupled to each other, and each pair of lower electrode 101 and upper electrode 102 that are capacitively coupled to each other form a capacitor cell C.

The manufacturing method includes a plurality of cell terminals 103 including a portion formed in a third layer different from the first and second layers of the semiconductor substrate, arranged at a period d1 in the X direction, and a period in the Y direction. A step of forming a plurality of cell terminals 103 arranged at d2 and electrically connected to the plurality of lower electrodes 101, and a plurality of cell terminals 104 including a portion formed in the third layer of the semiconductor substrate and forming a plurality of cell terminals 104 arranged in the X direction at a period d1 and arranged in the Y direction at a period d2 and electrically connected to the plurality of upper electrodes 102, respectively, is performed. The second layer is located between the first and third layers. The step of forming each cell terminal 104 is arranged with respect to each cell terminal 103 by being shifted by half the length of the period d1 in the X direction and by being shifted by half the length of the period d2 in the Y direction.

The manufacturing method further includes forming at least two external terminals that are respectively electrically connected to a part of the plurality of cell terminals including the plurality of cell terminals 103 and the plurality of cell terminals 104.

Figure 34:
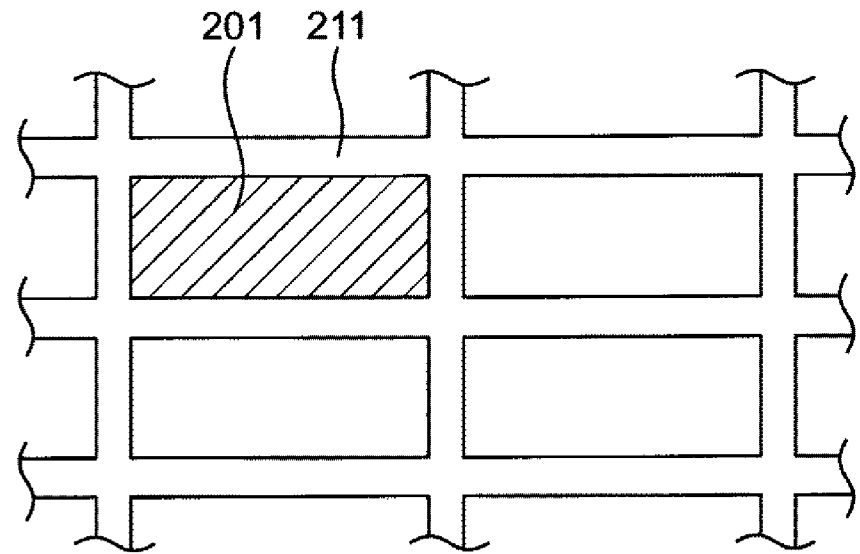
FIG. 34 is a schematic diagram for explaining a method for manufacturing a capacitor device according to third to eleventh embodiments.
Figure 35:
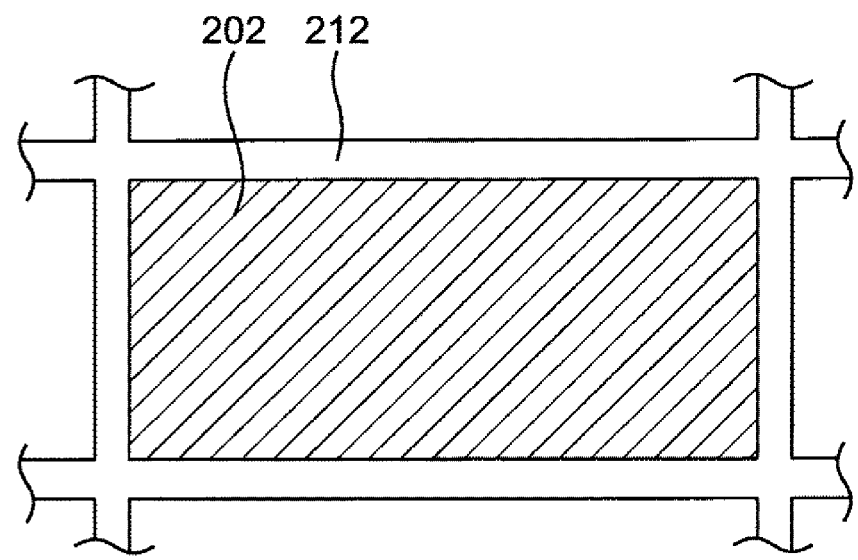
FIG. 35 is a schematic diagram for explaining a method for manufacturing a capacitor device according to third to eleventh embodiments.

FIGS. 34 and 35 are schematic views for explaining the capacitor device manufacturing method according to the third to eleventh embodiments.

At present, a capacitor device of a type called MLCC (multilayer ceramic capacitor) is generally used as a decoupling capacitor. Many of such capacitor devices have a rectangular parallelepiped outer shape and are external terminals having the shapes described in the third to eleventh embodiments, and have been described in the third to eleventh embodiments. Thus, an external terminal connected to an external circuit is provided. Various configurations can be taken by providing compatibility with MLCC when mounting the capacitor device and changing only one mask to meet customer requirements.

MLCC capacitor devices are available in various sizes. When manufacturing a capacitor device, a scribe line and a guard ring are arranged so that a chip having the smallest size can be cut out from a silicon wafer. In the capacitor device according to the third to eleventh embodiments of the present invention, the size of the capacitor device can be changed by changing only three masks as described below. Thereafter, by removing the scribe line and the guard ring, it is possible to connect the chips of each capacitor device with metal wiring. For this reason, the size of the capacitor device can be changed to be scalable.

Referring to FIG. 34, metal wiring 211 used as a scribe line and a guard ring is formed on a semiconductor substrate in the manufacturing process of the capacitor device. The capacitor device region 201 has, for example, a 05025 size (500×250 µm). When manufacturing a capacitor device having a size larger than that of the region 201, as shown in FIG. 35, a metal wiring 212 is formed on the semiconductor substrate. Thereby, for example, the region 202 of the capacitor device having a 1005 size (1000×500 µm) can be obtained.

The manufacturing method performs the following steps according to a desired position where the external terminal is electrically connected to a circuit outside the capacitor device, a desired capacitance and desired breakdown voltage of the capacitor device, and a size of the capacitor device. That is, the manufacturing method includes a step of selecting a first mask for forming a metal wiring used as a scribe line and a guard ring, a step of selecting a second mask for forming an external terminal, selecting a third mask for forming a cell terminal for connecting the metal wiring and the external terminal to each other among the cell terminals.

According to the capacitor devices according to the third to eleventh embodiments, only a small number of masks need be changed, so that the design change of the capacitor device can be performed at low cost.

When it is planned to use the capacitor device of FIG. 18 for a plurality of applications, the number of rows and/or columns of the capacitor cell C of the capacitor device is equal to the number of capacitor cells connected in series required for each application, set to least common multiple or multiple.

INDUSTRIAL APPLICABILITY

The capacitor device according to each embodiment of the present invention is useful, for example, as an on-package decoupling capacitor. In semiconductor devices, there are problems such as a decrease in voltage tolerance range due to a decrease in power supply voltage, generation of large power supply noise or ground noise due to an increase in current consumption, and a decrease in EMI resistance due to an increase in operating frequency. In order to reduce this problem, it is effective to use a decoupling capacitor. By using the capacitor device according to each embodiment of the present invention, it is possible to provide a semiconductor device in which the above problems are reduced.

EXPLANATION OF SYMBOLS 1, 1A . . . Oxide film,
2, 2-1, 2-2 . . . Metal film,
3 . . . Nitride film,
4, 4-1, 4-2 . . . Conductor film,
5, 5-1, 5-2 . . . Insulating film,
6, 6-1, 6-2 . . . conductor film,
7 . . . nitride film,
8 . . . doped silicon,
9, 9-1, 9-2 . . . metal film,
10 . . . via conductor,
11 . . . via conductor,
12 . . . Interlayer oxide film,
13 . . . pad conductor,
14 . . . pad conductor,
15 . . . passivation film,
16 . . . silicon substrate,
17 . . . opening,
18 . . . oxide film,
19 . . . photoresist,
20 . . . opening,
21 . . . barrier metal,
22 . . . Barrier metal,
30, 30-1, 30-2 . . . Capacitor cell,
100, 100A . . . Unit cell,
101 . . . Lower electrode,
102 . . . Upper electrode,
103 . . . Cell terminal,
104 . . . Cell terminal,
105, 105a~105D . . . external terminals,
106, 106a~106D . . . external terminals,
107, 108 . . . floating terminals,
111~113, 121~127 . . . external terminals,
201, 202 . . . area of the capacitor device,
211, 212 . . . metal wiring.

What is claimed is:

1. A capacitor device, comprising a plurality of capacitor cells having sides extending along a first direction and a second direction orthogonal to each other, the capacitor device comprising:
a plurality of first electrodes, comprising a portion formed in a first metal film layer of the capacitor cells, arranged in a first period in the first direction and in a second period in the second direction;
a plurality of second electrodes, comprising a portion formed in a second metal film layer different from the first metal film layer of the capacitor cells, arranged in the first period in the first direction and in the second period in the second direction above the plurality of first electrodes, wherein one of the plurality of second electrodes has a position which is shifted by half a total length of the first period in the first direction and half a total length of the second period in the second direction with respect to a position of a corresponding one of the plurality of first electrodes, wherein the one of the plurality of second electrodes and the corresponding one of the plurality of first electrodes form a pair of electrodes among the plurality of first and second electrodes, wherein the pair of the first and second electrodes are partially opposed to each other and coupled capacitively to each other to form a capacitor cell;

a plurality of first cell terminals, comprising portions formed in a third metal film layer of the capacitor cells different from the first and second metal film layers, arranged in the first period in the first direction and in the second period in the second direction, and electrically connected to the plurality of first electrodes respectively; and a plurality of second cell terminals, comprising portions formed in the third metal film layer of the capacitor cells, arranged in the first period in the first direction and in the second period in the second direction, and electrically connected to the plurality of second electrodes respectively;

wherein the second metal film layer is located between the first and third metal film layers, and each of the plurality of second cell terminals has a position that is shifted by half a total length of the first period in the first direction and half a total length of the second period in the second direction, with respect to a position of a corresponding one of the plurality of first cell terminals.

2. The capacitor device according to claim 1, further comprising at least two external terminals, each of which is electrically connected to a portion of the plurality of first cell terminals and the plurality of second cell terminals.

3. The capacitor device according to claim 2, wherein the plurality of first and second cell terminals extend in an extending direction which is either the first direction or the second direction, and form a plurality of cell terminal rows adjacent to each other in the extending direction, wherein the capacitor device further comprises first and second external terminals each having a comb shape, wherein each of the first and second external terminals is electrically connected to every 2N cell terminal rows of the plurality of cell terminal rows when N is an integer, wherein each of the first and second external terminals includes a plurality of first portions connect to each other and a second portion connects the first portions to each other, each of the plurality of first portions of the first external terminal and each of the plurality of first portions of the second external terminal are formed so as to be engaged with each other, and every N cell terminal rows of the plurality of cell terminal rows are arranged so as to be electrically connected to the first and second external terminals alternately.

4. The capacitor device according to claim 3, wherein each of the first and second external terminals is electrically connected to a circuit external to the capacitor device at a portion electrically connected to one of the plurality of cell terminal rows.

5. The capacitor device according to claim 2, wherein the plurality of first and second cell terminals extend in an extending direction which is either the first direction or the second direction, and form a plurality of cell terminal rows adjacent to each other in the extending direction, and wherein the capacitor device further comprises a first external terminal, having a fishbone shape; and second and third external terminals, each having a comb shape;

wherein a plurality of first portions of the first external terminal electrically connect to the plurality of cell terminal rows at every 2N cell terminal rows of the plurality of cell terminal rows and a second portion of the first external terminal connects the plurality of first portions of the first external terminal to each other at respective centers of the plurality of first portions of the first external terminal;

wherein every 2N cell terminal rows of the plurality of cell terminal rows comprises a plurality of cell terminals a part of which electrically connects to a plurality of first portions of the second external terminal, a second portion of the second external terminal connects the plurality of first portions of the second external terminal to each other, and the second portion of the second external terminal is formed so as to be engaged with the plurality of first portions of the first external terminal on a first side with the second portion of the first external terminal as a reference;

wherein every 2N cell terminal rows of the plurality of cell terminal rows comprises a plurality of cell terminals a part of which electrically connects to a plurality of first portions of the third external terminal, a second portion of the third external terminal connects the plurality of first portions of the third external terminal to each other, and the second portion of the third external terminal is formed so as to be engaged with the plurality of first portions of the first external terminal on a second side opposite to the first side with the second portion of the first external terminal as a reference; and wherein every N cell terminal rows of the plurality of cell terminal rows are arranged so as to connect to the first external terminal and the second external terminal or the third external terminal alternately.

6. The capacitor device according to claim 2, wherein the plurality of first and second cell terminals extend in an extending direction which is either the first direction or the second direction, and form a plurality of cell terminal rows adjacent to each other in the extending direction, wherein the capacitor device further comprises a first external terminal having a meander shape and second and third external terminals each having a comb shape;

wherein a plurality of first portions of the first external terminal electrically connect to the plurality of cell terminal rows at every 2N cell terminal rows of the plurality of cell terminal rows and a second portion of the first external terminal connects the plurality of first portions of the first external terminal to each other at one of both ends in a longitudinal direction of the plurality of first portions of the first external terminal;

wherein every 4N cell terminal row of the plurality of cell terminal rows electrically connects to a plurality of first portions of the second external terminal, a second portion of the second external terminal connects the plurality of first portions of the second external terminal to each other, and the second portion of the second external terminal is formed so as to be engaged with the plurality of first portions of the first external terminal on a first side with the first external terminal as a reference;

wherein every 4N cell terminal row of the plurality of cell terminal rows electrically connects to a plurality of first portions of the third external terminal, a second portion of the third external terminal connects the plurality of first portions of the third external terminal to each other, and the second portion of the third external terminal is formed so as to be engaged with the plurality of first portions of the first external terminal on a second side opposite to the first side with the first external terminal as a reference; and wherein every N cell terminal rows of the plurality of cell terminal rows are arranged so as to connect to the first external terminal and the second external terminal or the third external terminal alternately.

7. The capacitor device according to claim 2, wherein the plurality of first and second cell terminals extend in an extending direction which is either the first direction or the second direction, and form a plurality of cell terminal rows adjacent to each other in the extending direction, wherein the capacitor device further comprises a plurality of sets of external terminals, each set of external terminals comprising first and second external terminals, each of the first and second external terminals of each of the plurality of sets comprises a portion electrically connecting to at least one cell terminal row of the plurality of cell terminal rows, the plurality of cell terminal rows are arranged so that every 2N cell terminal rows of the plurality of cell terminal rows electrically connects alternately to the first and second external terminals of one of the plurality of sets of external terminals.

8. The capacitor device according to claim 1, wherein the capacitor cells have a first surface and a second surface, a first silicon oxide film exposed on the first surface, and a passivation film exposed on the second surface, wherein the plurality of first electrodes are formed on the first silicon oxide film and comprise a plurality of stacked conductor films, wherein the plurality of second electrodes comprise a plurality of conductor films which are laminated, wherein the capacitor device further comprises an insulating film formed between the plurality of first and second electrodes and a second silicon oxide film formed on the plurality of second electrodes, wherein the passivation film is formed on the second silicon oxide film, the plurality of first and second cell terminals are exposed on the second surface, and the plurality of first electrodes, the plurality of second electrodes and the insulating film form the capacitor cells.

9. The capacitor device according to claim 1, wherein each of the capacitor cells is formed as a crown type stacked capacitor.

10. A capacitor device, comprising at least one capacitor cell and having a first surface and a second surface, comprising:
   a first silicon oxide film, exposed to atmosphere on the first surface which is opposite to the second surface;
   a first electrode, formed on the first silicon oxide film, comprising a plurality of stacked conductor films;
   a second electrode, comprising a plurality of stacked conductor films;
   an insulating film, formed between the first and second electrodes;
   a second silicon oxide film, formed on the second electrode;
   an exposed passivation film, formed on the second silicon oxide film and exposed to the atmosphere on the second surface;
   at least one first cell terminal, electrically connected to the first electrode and exposed to the atmosphere on the second surface;
   at least one second cell terminal, electrically connected to the second electrode and exposed to the atmosphere on the second surface; and
   the first electrode, the second electrode and the insulating film form the capacitor cell.

11. The capacitor device according to claim 10, wherein the capacitor cell is formed as a crown-type stack capacitor.

12. The capacitor device according to claim 10, wherein each of the first and second electrodes includes at least one metal film.

13. The capacitor device according to claim 10, wherein the insulating layer comprises one or more of $Ta_2O_5$ based material, $Al_2O_3$ based material, $HfO_2$ based material, $ZrO_2$ based material, and $TiO_2$ based material.

14. The capacitor device according to claim 10, wherein the at least one first cell terminal comprises a first pad conductor exposed to the atmosphere on the second surface, and a first via conductor electrically connected to the first electrode from the first pad conductor, the at least one second cell terminal comprises a second pad conductor exposed to the atmosphere on the second surface, and a second via conductor electrically connected to the second electrode from the second pad conductor.

15. The capacitor device according to claim 10, further comprising a plurality of capacitor cells stacked in a direction perpendicular to the first and second surfaces of the capacitor cells, each of the plurality of capacitor cells having a first electrode and a second electrode, wherein the at least one first cell terminal is connected to the first electrode of each of the plurality of capacitor cells, and the at least one second cell terminal is connected to the second electrode of each of the plurality of capacitor cells.

16. A manufacturing method of a capacitor device, the capacitor device comprising a plurality of capacitor cells having sides extending along a first direction and a second direction orthogonal to each other, the method comprising steps of:
   forming a plurality of first electrodes comprising a portion formed in a first metal film layer of the capacitor cells, arranged in a first period in the first direction and a second period in the second direction; and
   forming a plurality of second electrodes comprising a portion formed in a second metal film layer different from the first metal film layer of the capacitor cells, arranged in the first period in the first direction and in the second period in the second direction;
   wherein the step of forming the plurality of second electrodes comprises arranging the plurality of second electrodes at positions that are shifted with respect to positions of corresponding ones of the plurality of first electrodes by half a total length of the first period in the first direction and half a total length of the second period in the second direction;
   wherein one of the plurality of first electrodes and a corresponding one of the plurality of second electrodes are partially opposed and capacitively coupled to each other to form a pair of electrodes among the plurality of first and second electrodes, and the pair of electrodes are capacitively coupled to each other to form a capacitor cell;
   forming a plurality of first cell terminals comprising portions formed in a third metal film layer different from the first and second metal film layers of the capacitor cells, arranged in the first period in the first direction and in the second period in the second direction, and forming a plurality of first cell terminals such that they are electrically connected to the plurality of first electrodes respectively, and
   forming a plurality of second cell terminals comprising portions formed in the third metal film layer of the capacitor cells, arranged in the first period in the first direction and in the second period in the second direction, and forming the plurality of second cell terminals such that they are electrically connected to the plurality of second electrodes respectively;

wherein the second metal film layer is disposed between the first and third metal film layers; and wherein the step of forming the plurality of second cell terminals comprises arranging the plurality of second cell terminals at positions that are shifted with respect to positions of corresponding ones of the plurality of first cell terminals by half the total length of the first period in the first direction and half the total length of the second period in the second direction.

17. The manufacturing method according to claim 16, further comprising forming a plurality of external terminals, wherein at least one of the plurality of first cell terminals and the plurality of second cell terminals comprises a plurality of cell terminals a part of which are electrically connected to two of the plurality of external terminals.

18. The manufacturing method according to claim 17, further comprising steps of:

electrically connecting the plurality of external terminals to a circuit external to the capacitor device at a desired position to provide a desired capacitance and a desired breakdown voltage and a size of the capacitor device;

selecting a first mask for forming a metal wiring used as a scribe line and a guard ring;

selecting a second mask for forming the external terminals; and selecting a third mask for forming a cell terminal for connecting the metal wiring and the external terminals among the plurality of first and second cell terminals.

* * * * *